United States Patent
Park et al.

(10) Patent No.: US 9,437,452 B2
(45) Date of Patent: Sep. 6, 2016

(54) METHOD OF FORMING A FINE PATTERN BY USING BLOCK COPOLYMERS

(71) Applicant: Samsung Electronics Co., Ltd., Suwon-Si, Gyeonggi-Do (KR)

(72) Inventors: Jeong-ju Park, Hwaseong-si (KR); Hyoung-hee Kim, Hwaseong-si (KR); Kyoung-mi Kim, Anyang-si (KR); Se-kyung Baek, Hwaseong-si (KR); Soo-jin Lee, Anyang-si (KR); Jae-ho Kim, Yongin-si (KR); Jung-sik Choi, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/604,123

(22) Filed: Jan. 23, 2015

(65) Prior Publication Data

US 2015/0243525 A1 Aug. 27, 2015

(30) Foreign Application Priority Data

Feb. 27, 2014 (KR) ........................ 10-2014-0023715

(51) Int. Cl.
*H01L 21/311* (2006.01)
*H01L 21/3105* (2006.01)
(Continued)

(52) U.S. Cl.
CPC ....... *H01L 21/31144* (2013.01); *G03F 7/0002* (2013.01); *H01L 21/0273* (2013.01);
(Continued)

(58) Field of Classification Search
CPC ........... H01L 21/0273; H01L 21/0337; H01L 21/3086; H01L 21/31058; H01L 21/31144; H01L 21/32139
USPC ................ 438/703, 702, 156, 299; 257/506; 428/137; 216/22; 430/5, 324
See application file for complete search history.

(56) References Cited

U.S. PATENT DOCUMENTS 7,335,464 B2 * 2/2008 Takano ..................... G03F 7/40
430/270.1
7,553,760 B2 6/2009 Yang et al.
(Continued)

FOREIGN PATENT DOCUMENTS

KR 100935863 B1 1/2010
KR 20120126725 A 11/2012
(Continued)

OTHER PUBLICATIONS

Joy Cheng et al., Characterization of DSA Features, 2011 Symposium on Lithography Extensions, 19 pages.
(Continued)

*Primary Examiner* — Mohammed Shamsuzzaman
(74) *Attorney, Agent, or Firm* — Harness, Dickey & Pierce, P.L.C.

(57) ABSTRACT

A method of forming a fine pattern includes forming a phase separation guide layer on a substrate, forming a neutral layer on the phase separation guide layer, forming a first pattern including first openings on the neutral layer, forming a second pattern including second openings each having a smaller width than each of the first openings, forming a neutral pattern including guide patterns exposing a portion of the phase separation guide layer by etching an exposed portion of the neutral layer by using the second pattern as an etch mask, removing the second pattern to expose a top surface of the neutral pattern, forming a material layer including a block copolymer on the neutral pattern and the phase separation guide layer exposed through the guide patterns, and forming a fine pattern layer including a first block and a second block on the neutral pattern and the phase separation guide layer.

5 Claims, 23 Drawing Sheets

(51) Int. Cl.
*H01L 21/027* (2006.01)
*H01L 21/033* (2006.01)
*H01L 21/308* (2006.01)
*H01L 21/3213* (2006.01)
*G03F 7/00* (2006.01)

(52) U.S. Cl.
CPC ....... *H01L21/0337* (2013.01); *H01L 21/3086* (2013.01); *H01L 21/31058* (2013.01); *H01L 21/32139* (2013.01)

(56) References Cited

U.S. PATENT DOCUMENTS

| | | | |
|---|---|---|---|
| 7,713,753 | B2 | 5/2010 | Xiao et al. |
| 7,923,373 | B2 | 4/2011 | Sandhu |
| 8,039,196 | B2 | 10/2011 | Kim et al. |
| 8,119,017 | B2 | 2/2012 | Albrecht et al. |
| 8,247,166 | B2* | 8/2012 | Takemura ............. G03F 7/0035 430/324 |
| 8,399,174 | B2 | 3/2013 | Kim et al. |
| 8,481,429 | B2 | 7/2013 | Kim et al. |
| 8,486,511 | B2 | 7/2013 | Black et al. |
| 8,900,468 | B2* | 12/2014 | Kim ...................... G03F 7/0035 216/46 |
| 2006/0063077 | A1* | 3/2006 | Hata ........................ G03F 7/40 430/5 |
| 2009/0179002 | A1 | 7/2009 | Cheng et al. |
| 2009/0214823 | A1* | 8/2009 | Cheng ................ B81C 1/00031 428/137 |
| 2009/0308837 | A1* | 12/2009 | Albrecht ................ G11B 5/855 216/22 |
| 2010/0167214 | A1* | 7/2010 | Yoon ................... B81C 1/00031 430/323 |
| 2010/0294740 | A1 | 11/2010 | Cheng et al. |
| 2010/0297847 | A1 | 11/2010 | Cheng et al. |
| 2011/0147983 | A1 | 6/2011 | Cheng et al. |
| 2011/0147984 | A1 | 6/2011 | Cheng et al. |
| 2012/0202017 | A1 | 8/2012 | Nealey et al. |
| 2013/0059438 | A1 | 3/2013 | Zhou et al. |
| 2013/0126473 | A1 | 5/2013 | Dobisz et al. |
| 2013/0133825 | A1 | 5/2013 | Hattori et al. |
| 2015/0086929 | A1* | 3/2015 | Hatakeyama ............. G03F 7/40 430/324 |
| 2015/0228475 | A1* | 8/2015 | Ban ..................... H01L 21/0337 216/49 |
| 2015/0243514 | A1* | 8/2015 | Ruiz ................... H01L 21/3086 438/702 |
| 2015/0364335 | A1* | 12/2015 | Wuister ................ G03F 7/0002 257/288 |

FOREIGN PATENT DOCUMENTS

| | | |
|---|---|---|
| KR | 20130032071 A | 4/2013 |
| KR | 20130034778 A | 4/2013 |
| KR | 20130054982 A | 5/2013 |
| KR | 101291223 B1 | 7/2013 |

OTHER PUBLICATIONS

Douglas J. Guerrero et al., Multifunctional hardmask neutral layer for directed self-assembly (DSA patterning, Proceedings of SPIE, vol. 8680, 2013, 9 pages.

Sang-Min Park et al., Patterning sub-10 nm line patterns from a block copolymer hybrid, Nanotechnology 19 (2008) 455304 (6pp).

* cited by examiner

METHOD OF FORMING A FINE PATTERN BY USING BLOCK COPOLYMERS

CROSS-REFERENCE TO RELATED APPLICATIONS

This application claims priority to Korean Patent Application No. 10-2014-0023715, filed on Feb. 27, 2014, in the Korean Intellectual Property Office, the disclosure of which is incorporated herein in its entirety by reference.

BACKGROUND

The inventive concepts relate to a method of forming a fine pattern for manufacturing a semiconductor device, and more particularly, to a method of forming a fine pattern using block copolymers.

With the increase in the integration degree of semiconductor devices, a planar area occupied by each unit cell has decreased. In response to such a decrease in the planar area, a design rule of a nano-scale critical dimension (CD) has been applied. Accordingly, a new technology for forming a fine pattern, such as a fine contact hole pattern having a nano-scale opening size or a fine line pattern having a nano-scale width, is required.

SUMMARY

The inventive concepts provide a method of forming a fine pattern, which may relatively easily implement a fine-pitch pattern that is necessary to manufacture a highly-integrated semiconductor device that transcends a resolution limit in a photolithography process.

According to some example embodiments of the inventive concepts, there is provided a method of forming a fine pattern, the method including: forming a phase separation guide layer on a substrate, forming a neutral layer on the phase separation guide layer, forming a first pattern including a plurality of first openings on the neutral layer; changing the first pattern to form a second pattern including a plurality of second openings each having a smaller width than each of the plurality of first openings; forming a neutral pattern including a plurality of guide patterns exposing a portion of the phase separation guide layer by etching an exposed portion of the neutral layer by using the second pattern as an etch mask, removing the second pattern to expose a top surface of the neutral pattern, forming a material layer including a block copolymer on the neutral pattern and the phase separation guide layer exposed through the plurality of guide patterns, and forming a fine pattern layer including a first block and a second block, which result from phase separation of the block copolymer, on the neutral pattern and the phase separation guide layer.

Each of the plurality of guide patterns of the neutral pattern may have a width that is equal to about half the width of any one of the first openings of the first pattern.

In some example embodiments, the plurality of guide patterns of the neutral pattern may be of a hole type and have a honeycomb structure that is repetitively formed at a predetermined or desired pitch in a radial direction at an interval of a selected angle around any one of the plurality of guide patterns. A distance between two guide patterns disposed in the radial direction at an interval, which is about two times greater than the selected angle, around any one of the plurality of guide patterns may be about five times the width of any one of the guide patterns.

In some example embodiments, the first block of the fine pattern layer may be disposed in a contact hole pattern, a plurality of guide patterns arranged in a fourth direction among the plurality of guide patterns may be repetitively formed at a first guide pitch $Pg\_1$, a first block arranged in the fourth direction among the first block of the fine pattern layer may be repetitively disposed at a first block pitch $Pb\_1$, and the first block pitch $Pb\_1$ may be represented by an equation $Pb\_1 = \frac{1}{3} \cdot Pg\_1$.

A distance between two guide patterns disposed in the radial direction at the interval of the selected angle around any one of the plurality of guide patterns may be about $(2n+1)$ times the width of any one of the guide patterns, where n is a positive integer.

In some example embodiments, the first block of the fine pattern layer may be disposed in a contact hole pattern, a plurality of guide patterns arranged in a first direction among the plurality of guide patterns may be repetitively formed at a second guide pitch $Pg\_2$, a first block arranged in the first direction among the first block of the fine pattern layer may be repetitively disposed at a second block pitch $Pb\_2$, and the second block pitch $Pb\_2$ may be represented by an equation $Pb\_2 = \{1/(n+1)\} \cdot Pg\_2$, where n is a positive integer.

In some example embodiments, the forming of the second pattern may include: coating a property changing layer on the first pattern; heat-treating the first pattern coated with the property changing layer; and removing a property changing layer that remains after the heat-treating. In other example embodiments, the forming of the second pattern may include forming a capping layer including an acid source on an exposed surface of the first pattern.

In some example embodiments, the plurality of guide patterns of the neutral pattern may be of a line type and be repetitively formed at a predetermined or desired pitch in a first direction. When a width of each of the plurality of guide patterns in a predetermined or desired direction is X, a width Y of the neutral pattern in the predetermined or desired direction may be $(2n+1) \cdot X$, where n is a positive integer.

According to some example embodiments of the inventive concepts, there is provided a method of forming a fine pattern, the method including: forming a phase separation guide layer on an etching target film; forming a neutral pattern including a plurality of holes of a honeycomb structure, which is repetitively formed at a predetermined or desired pitch in a radial direction at an interval of a selected angle around one of the plurality of holes, on the phase separation guide layer; forming a material layer including a block copolymer on the neutral pattern and the phase separation guide layer exposed through the plurality of holes; phase-separating the material layer to form a plurality of first polymer blocks disposed at a plurality of first points on the phase separation guide layer and at a plurality of second points on the neutral pattern and to form a second polymer block disposed on the neutral pattern; removing the plurality of first polymer blocks; and etching the phase separation guide layer and the etching target film by using the second polymer block as an etch mask.

In some example embodiments, the plurality of second points may include a plurality of points that are disposed in a radial direction around any one of the plurality of first points. Also, the plurality of second points may be formed between two adjacent points among the plurality of first points.

The plurality of second points may be formed at a position that is shifted from a region between two adjacent points among the plurality of first points.

Some example embodiments may provide a method of forming a fine pattern, the method including: forming a phase separation guide layer on a substrate; forming a neutral pattern comprising a plurality of holes of a first honeycomb structure that is repetitively formed at a first pitch on the phase separation guide layer; forming a material layer comprising a block copolymer on the neutral pattern and the phase separation guide layer exposed through the plurality of holes; and phase-separating the material layer to form a fine pattern layer comprising a first block and a second block of a second honeycomb structure that is repetitively formed at a second pitch.

In some example embodiments, the second pitch of the second honeycomb structure may be smaller than the first pitch of the first honeycomb structure.

The phase separation guide layer may have a high surface energy affinity with respect to any one of the first block and the second block.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF EXAMPLE EMBODIMENTS

Figure 1A:
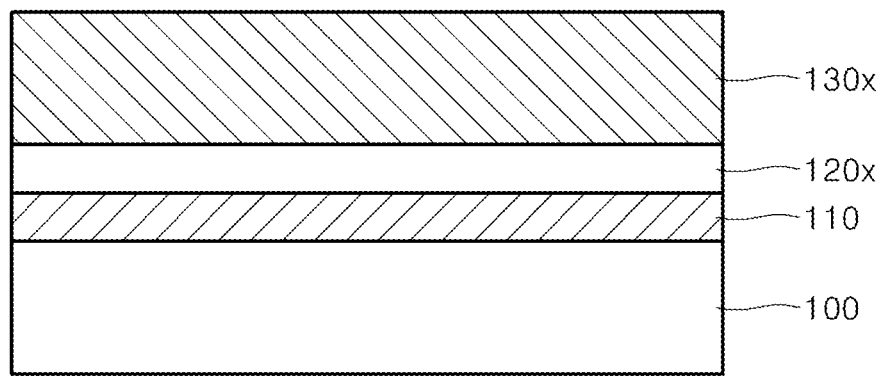
FIGS. 1A to 1I are sequential cross-sectional views illustrating a method of forming a fine pattern, according to an example embodiment of the inventive concepts.

As used herein, the term "and/or" includes any and all combinations of one or more of the associated listed items. Expressions such as "at least one of," when preceding a list of elements, modify the entire list of elements and do not modify the individual elements of the list.

Hereinafter, example embodiments of the inventive concepts will be described in detail with reference to the accompanying drawings. Like reference numerals in the drawings denote like elements, and thus their redundant description will be omitted.

The inventive concepts will now be described more fully with reference to the accompanying drawings, in which some example embodiments of the inventive concepts are shown. The inventive concepts may, however, be embodied in many different forms and should not be construed as being limited to the example embodiments set forth herein; rather, these example embodiments are provided so that this disclosure will be thorough and complete, and will fully convey the inventive concepts to those of ordinary skill in the art.

It will be understood that although the terms "first", "second", etc. are used herein to describe members, regions, layers, portions, sections, components, and/or elements in some example embodiments of the inventive concepts, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concepts. For example, a first element may also be referred to as a second element, and similarly, a second element may also be referred to as a first element, without departing from the scope of the inventive concepts.

Unless otherwise defined, all terms (including technical and scientific terms) used herein have the same meaning as commonly understood by those of ordinary skill in the art to which the inventive concepts pertain. It will also be understood that terms, such as those defined in commonly used dictionaries, should be interpreted as having a meaning that is consistent with their meaning in the context of the relevant art and will not be interpreted in an idealized or overly formal sense unless expressly so defined herein.

When a certain example embodiment may be implemented differently, a specific process order may be performed differently from the described order. For example, two consecutively described processes may be performed substantially at the same time or performed in an order opposite to the described order.

In the accompanying drawings, variations from the illustrated shapes as a result, for example, of manufacturing techniques and/or tolerances, are to be expected. Thus, the example embodiments of the inventive concepts should not be construed as being limited to the particular shapes of regions illustrated herein but may be to include deviations in shapes that result, for example, from a manufacturing process.

In the inventive concepts, in order to implement a fine-pitch pattern to manufacture a highly-integrated semiconductor device that transcends a resolution limit in a photolithography process, a pattern density is increased by adjusting a pattern pitch by using self-assembly characteristics of a particular compound or polymer. A repetitive fine structure may be obtained through spontaneous self-assembly by using a phase-separation phenomenon of a block copolymer. In a pattern forming process using the self-assembly characteristics of a block copolymer, the size of a fine pattern obtained is approximately similar to the thickness of a single molecular layer. Therefore, the pattern forming process using the self-assembly characteristics of a block copolymer may form a fine pattern that transcends a resolution limit in the conventional photolithography process.

The block copolymer is a functional polymer that is generated when two or more polymer blocks having different structures are combined into one polymer through a covalent bond. The respective polymer blocks constituting the block copolymer have different mixing characteristics and selective solubility due to a difference between the respective chemical structures. Thus, the block copolymer forms a self-assembled structure by phase separation or selective solution in a solution phase or a solid phase. The formation of a particular-shaped fine structure by the block copolymer is affected by the physical/chemical characteristics of the polymer blocks. For example, when a diblock copolymer, which is formed of two different polymers, is self-assembled on a bulk substrate, a volume fraction of each polymer block constituting the block copolymer is primarily affected by a molecular weight of each polymer block. Depending on the volume ratio between two polymer blocks, the self-assembled structure of the block copolymer has one of various structures, such as, a cubic structure and a double gyroid structure that are three-dimensional structures, and a hexagonal packed column structure and a lamellar structure that are two-dimensional structures. In each structure, the size of each polymer block is proportional to the molecular weight of the polymer block.

Block copolymers, which are self-assembled in a hexagonal column structure or a lamellar structure that is a two-dimensional structure, may be used to form a fine pattern of a semiconductor device. In the case of the hexagonal column structure, since cylindrical columns are packed in a hexagonal shape, the orientation of an obtained structure is relatively simple, and, depending on the orientation direction of the columns, a line and space pattern may be formed or a repetitive hole pattern structure may be formed. In the case of the lamellar structure, a two-dimensional plate structure is repeated, and when a lamellar block copolymer is oriented perpendicular to a substrate surface, a line and space pattern having a large aspect ratio may be formed.

In the self-assembled structure of the block copolymer, a fine self-assembled structure of several to several tens of nanometers is formed in proportion to the molecular size of a polymer. In the case of the self-assembled structure of the block copolymer, expensive equipment required in a processing technology such as a general photolithography process is unnecessary, and by using a spontaneous thermodynamic process, the number of processes is significantly reduced and thus the pattern forming process may be simplified. Also, by forming a fine pattern by using the self-assembly characteristics of block copolymers, since an ultra-fine pattern of several to several tens of nanometers, which is difficult to achieve using a general processing technology, may be formed, the inventive concepts have various applicabilities in future fields of electronic devices.

In order to use the self-assembly characteristics of block copolymers to form a fine pattern that is necessary to manufacture a semiconductor device, a material layer including block copolymers is formed in the shape of a thin film on a planar film on a substrate and is heated to a temperature that is higher than a glass transition temperature of the block copolymers, thereby inducing self-assembly thereof. Herein, the most important point is to adjust the orientation of the fine structure obtained by the self-assembly of the block copolymers. However, since a self-assembly phenomenon of polymers is a spontaneous process intended for molecules to exist in a thermodynamically stable state and is intended to increase entropy, the obtained self-assembled structure is oriented according to a predetermined or desired design. In a fine pattern forming method according to the inventive concepts, a phase separation guide layer and a neutral pattern are formed to induce an orientation in the spontaneous self-assembly of block copolymers. In particular, a minimum guide pattern that is necessary to induce the orientation of block copolymers is formed in the neutral pattern, and the guide pattern is used as a guide to induce a spontaneous self-alignment of the block copolymers so that a fine pattern having a density higher than the formation density of the guide pattern is formed thereon.

The fine pattern forming method according to the inventive concepts will be described in more detail with reference to the accompanying drawings. The inventive concepts may, however, be embodied in many different forms and should not be construed as being limited to the example embodiments set forth herein; rather, these example embodiments are provided so that this disclosure will be thorough and complete, and will fully convey the inventive concepts to those of ordinary skill in the art. In addition, since various elements or regions are schematically illustrated in the drawings, the inventive concepts are not limited by relative sizes and distances illustrated in the drawings.

FIGS. 1A to 1I are sequential cross-sectional views illustrating a method of forming a fine pattern, according to an example embodiment of the inventive concepts.

Referring to FIG. 1A, a phase separation guide layer 110, a neutral layer 120x, and a photoresist film 3130x are formed on a substrate 100.

The substrate 100 may include silicon (Si), for example, crystalline Si, polycrystalline Si, or amorphous Si. In other example embodiments, the substrate 100 may include a semiconductor such as germanium (Ge), or a compound semiconductor such as silicon germanium (SiGe), silicon carbide (SiC), gallium arsenide (GaAs), indium arsenide (InAs), or indium phosphide (InP).

The phase separation guide layer 110 may be a silicon-containing material layer such as a silicon oxide layer, a silicon nitride layer, a silicon oxynitride layer, a silicon oxycarbide layer, a silicon-containing organic layer, or a siloxane resin layer. In some example embodiments, the phase separation guide layer 110 may be formed of an organic anti-reflective coating (ARC) film. When the phase separation guide layer 110 is formed of an organic ARC film, the organic ARC film may be any organic ARC film that is used in a general photolithography process. For example, an organic ARC material for a krypton fluoride (KrF) excimer laser, an argon fluoride (ArF) excimer laser, an ArF immersion (ArFi) excimer laser, or any other light source may be used to form the phase separation guide layer 110. In an example embodiment, an ARC material used in a dry lithography process or an ARC material used in an immersion lithography process may be used to form the phase separation guide layer 110. For example, the phase separation guide layer 110 may use any ARC material selected from Si-ARC, Ti-ARC, and Zr-ARC.

The phase separation guide layer 110 may be formed through a deposition process or a spin-coating process. In some example embodiments, a process of coating an organic ARC material on the substrate 100, heat-treating the resulting structure, and bridging the organic ARC material may be performed to form the phase separation guide layer 110.

The phase separation guide layer 110 may function to control the reflectance of a light source used in a photolithography process. The reflectance of the light source may be controlled by adjusting the composition, thickness, and absorbance of the phase separation guide layer 110.

The phase separation guide layer 110 may perform a guide function in a self-assembled structure forming process of block copolymers. In some example embodiments, the phase separation guide layer 110 may have a high surface energy affinity with respect to any one of a first block 150a and a second block 150b of a fine pattern layer 150 (see FIG. 1I).

The neutral layer 120x can be formed on a top surface of the phase separation guide layer 110.

The neutral layer 120x may be a random copolymer of the first block 150a and the second block 150b of the fine pattern layer 150 or derivatives thereof. For example, the neutral layer 120x may be a random copolymer of polystyrene-polymethylmethacrylate, polybutadiene-polybutylmethacrylate, polybutadiene-polydimethylsiloxane, polybutadiene-polymethylmethacrylate, polybutadiene-polyvinylpyridine, polybutylacrylate-polymethylmethacrylate, polybutylacrylate-polyvinylpyridine, polyisoprene-polyvinylpyridine, polyisoprene-polymethylmethacrylate, polyhexylacrylate-polyvinylpyridine, polyisobutylene-polybutylmethacrylate, polyisobutylene-polymethylmethacrylate, polyisobutylene-polybutylmethacrylate, polyisobutylene-polydimethylsiloxane, polybutylmethacrylate-polybutylacrylate, polyethylethylene-polymethylmethacrylate, polystyrene-polybutylmethacrylate, polystyrene-polybutadiene, polystyrene-polyisoprene, polystyrene-polydimethylsiloxane, polystyrene-polyvinylpyridine, polyethylethylene-polyvinylpyridine, polyethylene-polyvinylpyridine, polyvinylpyridine-polymethylmethacrylate, polyethyleneoxide-polyisoprene, polyethyleneoxide-polybutadiene, polyethyleneoxide-polystyrene, polyethyleneoxide-polymethylmethacrylate, polyethyleneoxide-polydimethylsiloxane, or polystyrene-polyethyleneoxide. However, the neutral layer 120x is not limited thereto and may be formed of various other random copolymers within the scope of the inventive concepts.

In some example embodiments, the neutral layer 120x may function to control the reflectance of a light source used in a photolithography process. The reflectance of the light source may be controlled by adjusting the composition, thickness, and absorbance of the neutral layer 120x.

The neutral layer 120x may perform a guide function in a self-assembled structure forming process of block copolymers, together with the phase separation guide layer 110. In some example embodiments, the neutral layer 120x may have a neutral surface energy affinity with respect to the first block 150a and the second block 150b of the fine pattern layer 150 (see FIG. 1I).

The photoresist film 130x is formed on a top surface of the neutral layer 120x.

Regardless of the type of a light source in a photolithography process, any photoresist material that may be used in a photolithography process may be used to form the photoresist film 130x. In some example embodiments, the photoresist film 130x may be formed of a material including a diazonaphthoquinone (DNQ)-based compound and a novolak resin. In other example embodiments, the photoresist film 130x may be formed of a general chemically-amplified resist composition containing a photo acid generator (PAG). For example, the photoresist film 130x may be formed of a g-line resist composition, an i-line resist composition, a KrF excimer laser resist composition, an ArF excimer laser resist composition, an F2 excimer laser resist composition, or an extreme ultraviolet (EUV) resist composition. The photoresist film 130x may be formed of a positive resist composition or a negative resist composition.

Figure 1B:
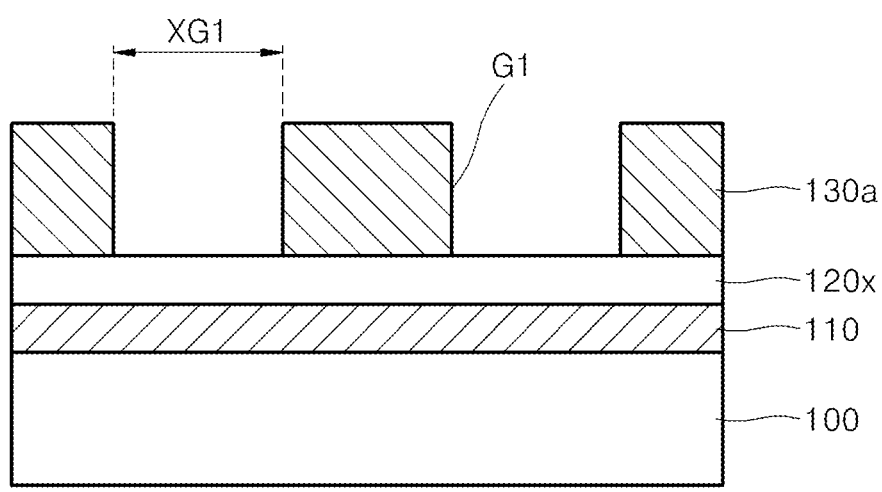

Referring to FIG. 1B, the photoresist film 10x is exposed and developed to form a first pattern 130a including a plurality of first openings G1. After the forming of the first pattern 130a, a portion of the neutral layer 120x is exposed through the plurality of first openings G1 of the first pattern 130a.

The planar shape of the first opening G1 of the first pattern 130a may be any one selected from a circular hole, an elliptical hole, a polygonal hole, a straight line, and a curved line.

In some example embodiments, when the planar shape of the first opening G1 is a circular hole, a width XG1 of the first opening G1 may be about 20 nm to about 100 nm. In other example embodiments, when the planar shape of the first opening G1 is a straight line, the width XG1 of the first opening G1 may be about 10 nm to about 50 nm.

Figure 1C:
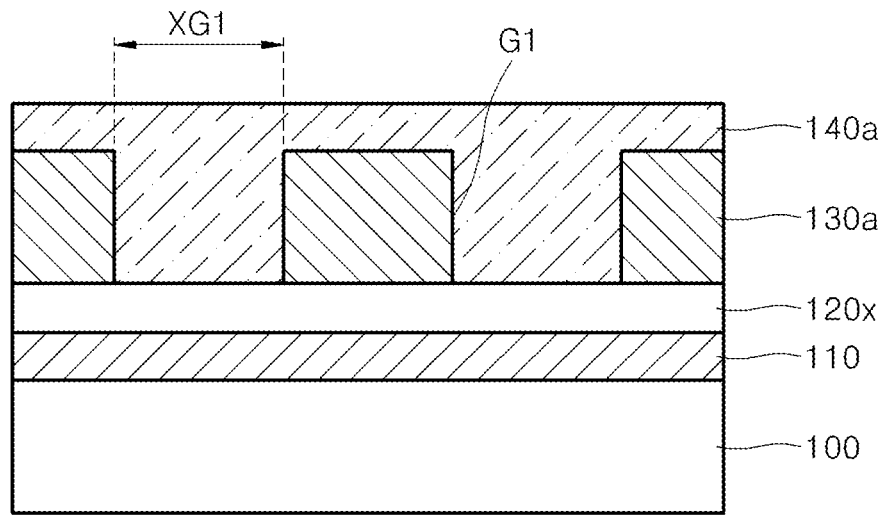
Figure 1D:
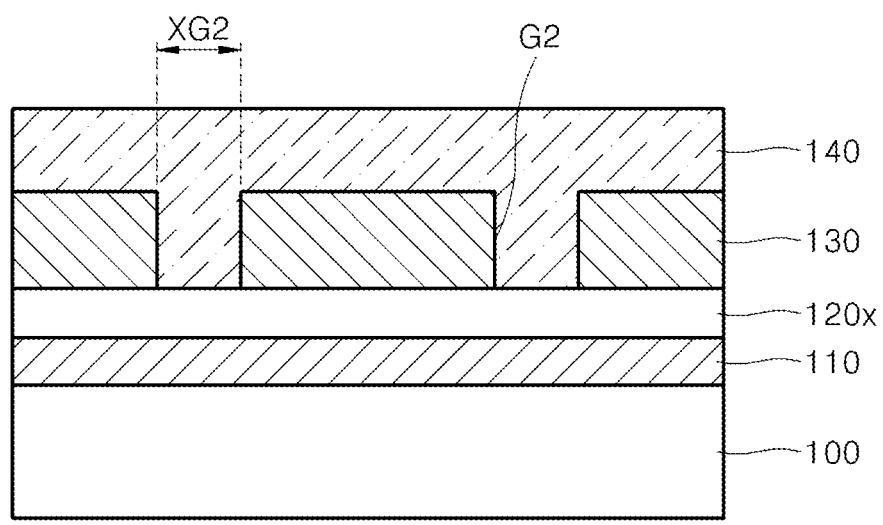
Figure 1E:
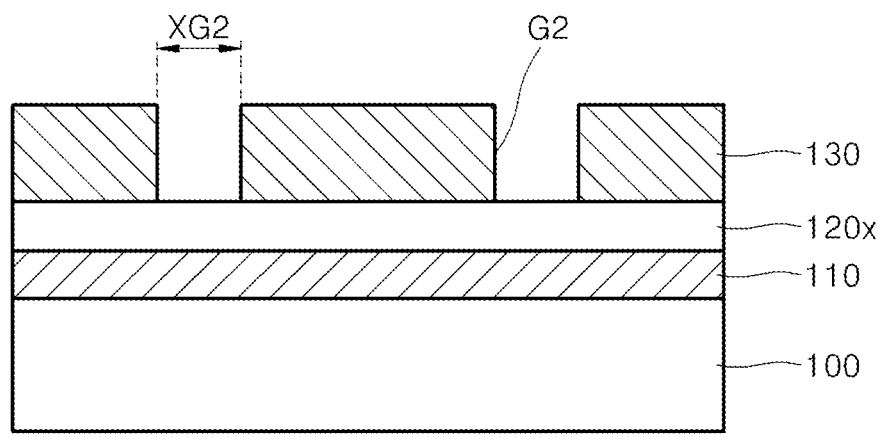

Referring to FIGS. 1C to 1E, the width of the first opening G1 is reduced to change the first pattern 130a into a second pattern 130 including a plurality of second openings G2.

In an example embodiment, the width XG1 of the first opening G1 is reduced to change the first pattern 130a to form a second pattern 130 including a plurality of second openings G2 having a width XG2 that is smaller than the width XG1 of the first opening G1. In some example embodiments, the second opening G2 may have a width XG2 that is equal to about the half of the width XG1 of the first opening G1 of the first pattern 130a.

In some example embodiments, the changing of the first pattern 130a into the second pattern 130 may include coating a property changing layer 140a on the first pattern 130a, heat-treating the resulting structure, and removing a property changing layer 140 remaining after the heat-treating by using deionized water.

For example, the property changing layer 140a may include an SAFIER™ (Shrink Assist Film for Enhanced Resolution) material. The property changing layer 140a may function to change the surface property of the first pattern 130a, that is, to reduce the glass transition temperature Tg of the first pattern 130a. When the resulting structure coated with the property changing layer 140a is heat-treated, the first pattern 130a flows while maintaining a sidewall shape of the first opening 1, thereby forming a second pattern 130 including a plurality of second openings G2 having a width XG2 that is smaller than the width XG1 of the first opening G1. In some example embodiments, the heat-treating may be performed at a temperature of about 120° C. to about 200° C. Since the property changing layer 140 remaining after the heat-treating is water-soluble, the property changing layer 140 may be removed by using deionized water.

Figure 1F:
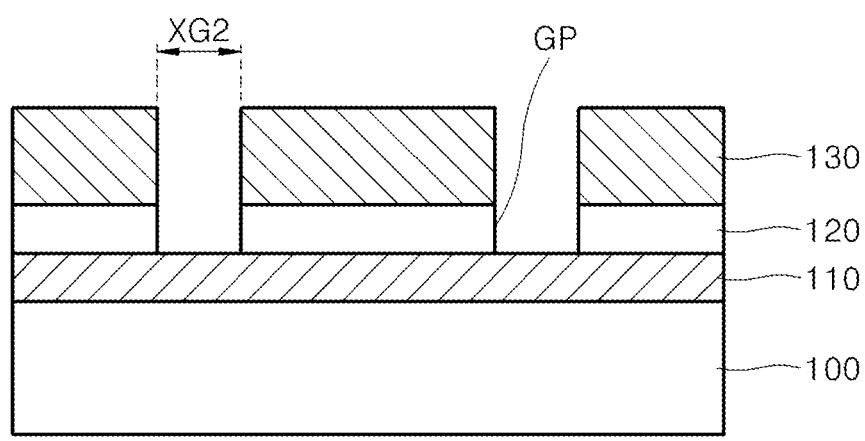

Referring to FIG. 1F, a neutral pattern 120 is formed by etching the neutral layer 120x using the second pattern 130 as an etch mask.

In an example embodiment, a neutral pattern 120 including a plurality of guide patterns GP exposing a portion of the phase separation guide layer 110 is formed by etching an exposed portion of the neutral layer 120x that is exposed through the plurality of openings G2 for the second pattern 130. The neutral pattern 120 may be formed by a dry etching process.

In some example embodiments, each of the plurality of guide patterns GP of the neutral pattern 120 may have a width that is equal to the width XG2 of the second opening G2 of the second pattern 130.

The planar shape of the guide pattern GP of the neutral pattern 120 may be any one selected from a circular hole, an elliptical hole, a polygonal hole, a straight line, and a curved line. In some example embodiments, when the planar shape of the guide pattern GP is a circular hole, the diameter of the guide pattern GP may be about 10 nm to about 50 nm. In other example embodiments, when the planar shape of the guide pattern GP is a straight line, a width XG1 of the guide pattern GP may be about 5 nm to about 30 nm. The planar shape of the guide pattern GP will be described later in detail with reference to FIGS. 3A to 6A.

Figure 1G:
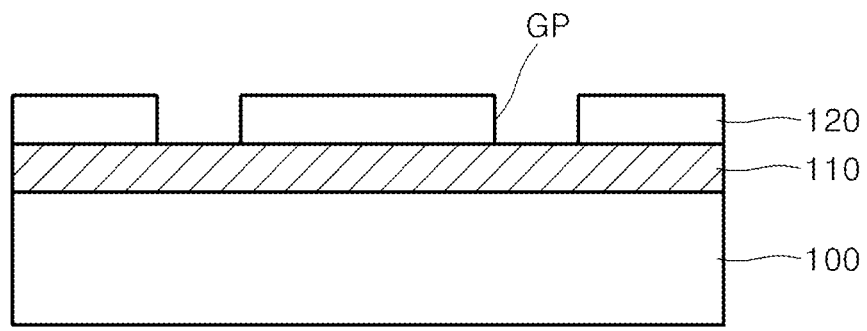

Referring to FIG. 1G, the second pattern 130 is removed to expose the top surface of the neutral pattern 120.

The second pattern 130 may be removed by a stripping process using a general solvent or thinner. In an example embodiment, the second pattern 130 may be removed by using an organic solvent such as PGMEA (Propylene Glycol Methyl Ether Acetate), PGME (Propylene Glycol Methyl Ether), or EL (Ethyl Lactate), and an alkali solvent such as TMAH (Tetra Methyl Ammonium Hydroxide), depending on the composition of the second pattern 130.

Figure 1H:
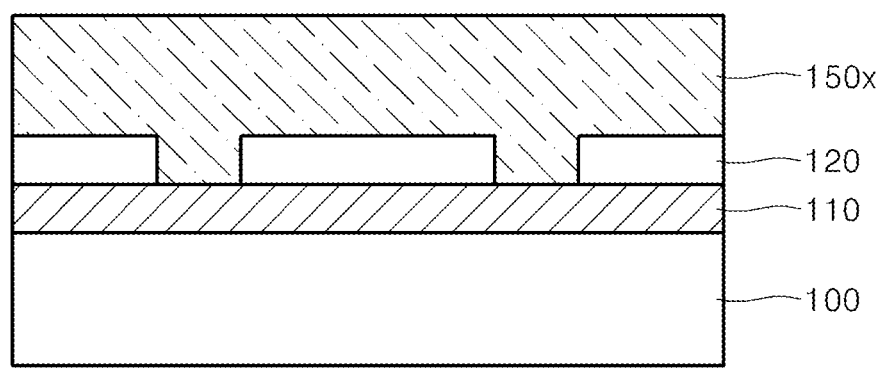

Referring to FIG. 1H, a material layer 150x including a block copolymer is formed on an exposed portion of the phase separation guide layer 110 and an exposed portion of the neutral pattern 120.

The material layer 150x may be formed by a spin-coating process.

The material layer 150x may include a block copolymer formed of at least two polymer blocks. For example, the block copolymer of the material layer 150x may be formed of a block copolymer in which a first polymer block and a second polymer block are covalently bonded at a volume ratio of about 1:1. In an example embodiment, the block copolymer may be formed of a diblock (AB) copolymer formed of two types of block copolymers A and B, a triblock (ABA) copolymer formed of two types of block copolymers A and B, or a triblock (ABC) copolymer formed of three types of block copolymers A, B, and C. The block copolymer may be formed of a linear or branched polymer having a molecular weight of about 3,000 g/mol to about 2,000,000 g/mol.

For example, when the block copolymer is a diblock copolymer formed of the first polymer block and the second polymer block, the block copolymer may include a polystyrene-polymethylmethacrylate copolymer, a polybutadiene-polybutylmethacrylate copolymer, a polybutadiene-polydimethylsiloxane copolymer, a polybutadiene-polymethylmethacrylate copolymer, a polybutadiene-polyvinylpyridine copolymer, a polybutylacrylate-polymethylmethacrylate copolymer, a polybutylacrylate-polyvinylpyridine copolymer, a polyisoprene-polyvinylpyridine copolymer, a polyisoprene-polymethylmethacrylate copolymer, a polyhexylacrylate-polyvinylpyridine copolymer, a polyisobutylene-polybutylmethacrylate copolymer, a polyisobutylene-polymethylmethacrylate copolymer, a polyisobutylene-polybutylmethacrylate copolymer, a polyisobutylene-polydimethylsiloxane copolymer, a polybutylmethacrylate-polybutylacrylate copolymer, a polyethylethylene-polymethylmethacrylate copolymer, a polystyrene-polybutylmethacrylate copolymer, a polystyrene-polybutadiene copolymer, a polystyrene-polyisoprene copolymer, a polystyrene-polydimethylsiloxane copolymer, a polystyrene-polyvinylpyridine copolymer, a polyethylethylene-polyvinylpyridine copolymer, a polyethylene-polyvinylpyridine copolymer, a polyvinylpyridine-polymethylmethacrylate copolymer, a polyethyleneoxide-polyisoprene copolymer, a polyethyleneoxide-polybutadiene copolymer, a polyethyleneoxide-polystyrene copolymer, a polyethyleneoxide-polymethylmethacrylate copolymer, a polyethyleneoxide-polydimethylsiloxane copolymer, or a polystyrene-polyethyleneoxide copolymer.

As another example, when the block copolymer is a triblock copolymer formed of the first polymer block and the second polymer block, the block copolymer may include a polystyrene-polymethylmethacrylate-polystyrene copolymer, a polybutadiene-polybutylmethacrylate-polybutadiene copolymer, a polybutadiene-polydimethylsiloxane-polybutadiene copolymer, a polybutadiene-polymethylmethacrylate-polybutadiene copolymer, a polybutadiene-polyvinylpyridine-polybutadiene copolymer, a polybutylacrylate-polymethylmethacrylate-polybutylacrylate copolymer, a polybutylacrylate-polyvinylpyridine-polybutylacrylate copolymer, a polyisoprene-polyvinylpyridine-polyisoprene copolymer, a polyisoprene-polymethylmethacrylate-polyisoprene copolymer, a polyhexylacrylate-polyvinylpyridine-polyhexylacrylate copolymer, a polyisobutylene-polybutylmethacrylate-polyisobutylene copolymer, a polyisobutylene-polymethylmethacrylate-polyisobutylene copolymer, a polyisobutylene-polybutylmethacrylate-polyisobutylene copolymer, a polyisobutylene-polydimethylsiloxane-polyisobutylene copolymer, a polybutylmethacrylate-polybutylacrylate-polybutylmethacrylate copolymer, a polyethylethylene-polymethylmethacrylate-polyethylethylene copolymer, a polystyrene-polybutylmethacrylate-polystyrene copolymer, a polystyrene-polybutadiene-polystyrene copolymer, a polystyrene-polyisoprene-polystyrene copolymer, a polystyrene-polydimethylsiloxane-polystyrene copolymer, a polystyrene-polyvinylpyridine-polystyrene copolymer, a polyethylethylene-polyvinylpyridine-polyethylethylene copolymer, a polyethylene-polyvinylpyridine-polyethylene copolymer, a polyvinylpyridine-polymethylmethacrylate-polyvinylpyridine copolymer, a polyethyleneoxide-polyisoprene-polyethyleneoxide copolymer, a polyethyleneoxide-polybutadiene-polyethyleneoxide copolymer, a polyethyleneoxide-polystyrene-polyethyleneoxide copolymer, a polyethyleneoxide-polymethylmethacrylate-polyethyleneoxide copolymer, a polyethyleneoxide-polydimethylsiloxane-polyethyleneoxide copolymer, or a polystyrene-polyethyleneoxide-polystyrene copolymer.

However, the block copolymer is not limited thereto and may include various other block copolymers within the scope of the inventive concepts.

Figure 1I:
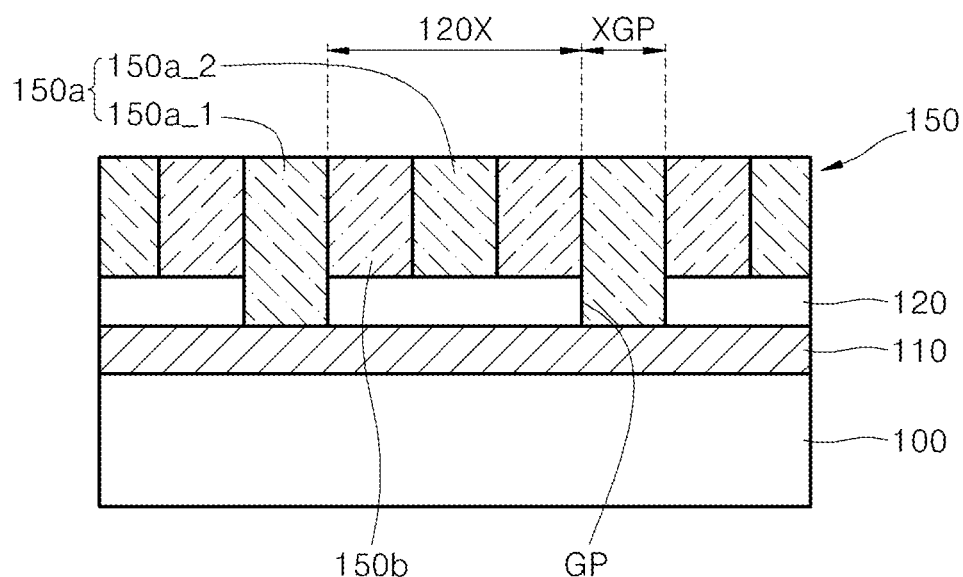

Referring to FIG. 1I, the elements of the material layer 150x are rearranged by the phase separation of the material layer 150x to form a fine pattern layer 150 including a first block 150a and a second block 150b formed of monomer units of different elements.

The first block 150a and the second block 150b have different polarities from each other, depending on the structure of a repeating unit of polymers constituting the first block 150a and the second block 150b. In an example embodiment, the phase separation guide layer 110 has a high affinity with respect to the first block 150a that is a polymer block having a hydrophilic group. In an example embodiment, the neutral pattern 120 does not have a selectivity with respect to any one of a polymer block having a hydrophilic group and a polymer block having a hydrophobic group. That is, the neutral layer 120x may have a neutral surface energy affinity with respect to the first block 150a and the second block 150b of the fine pattern layer 150.

The polymer blocks of the block copolymer phase-separated from the material layer 150x have different polarities from each other, depending on the hydrophilic groups included therein. Since the phase separation guide layer 110 has an affinity with respect to the polymer block among the polymer blocks having a higher hydrophile property or polarity, the phase separation guide layer 110 exposed through the guide pattern GP of the neutral pattern 120 guides the polymer block having a higher hydrophile property or polarity, that is, the first block 150a, so that a first block 150a_1 is self-aligned and addressed on the exposed portion of the phase separation guide layer 110. In an example embodiment, since the neutral pattern 120 does not have a selectivity with respect to any one of the polymer block having a hydrophilic group and the polymer block having a hydrophobic group, the polymer blocks are vertically oriented on the neutral pattern 120. In an example embodiment, the polymer blocks of the material layer 150x are vertically oriented on the neutral pattern 120 with respect to the first block 150a_1 addressed on the exposed portion of the phase separation guide layer 110. That is, following the first block 150a_1 addressed on the exposed portion of the phase separation guide layer 110, the second block 150b and a first block 150a_2 are sequentially and alternately disposed on the neutral pattern 120, thus generating pattern multiplication.

To rearrange the elements of the material layer 150x by the phase separation of the material layer 150x, the material layer 150x is annealed under a temperature higher than a glass transition temperature Tg_BC of the block copolymer of the material layer 150x. For example, for phase separation of the material layer 150x, the material layer 150x may be annealed for about 1 hour to about 24 hours under a temperature of about 100° C. to about 190° C. Herein, the material layer 150x may be annealed at a temperature that is higher than the glass transition temperature Tg_BC of the block copolymer of the material layer 150x and is lower than a glass transition temperature Tg_NP of the neutral pattern 120. This is to remove a possibility that the neutral pattern 120 will flow and be transformed by heat when the material layer 150x is annealed. The glass transition temperature Tg_BC of the block copolymer of the material layer 150x may vary depending on the molecular weight of the block copolymer. However, even when the material layer 150x is annealed at a temperature higher than the glass transition temperature Tg_NP of the neutral pattern 120, since the first block 150a of the fine pattern layer 150 formed by the annealing of the material layer 150x fills the guide pattern GP of the neutral pattern 120 while being self-aligned on the phase separation guide layer 110 exposed through the guide pattern GP of the neutral pattern 120, a flow distance caused by the thermal flow of the neutral pattern 120 is restricted by the first block 150a. Thus, the thermal flow of the neutral pattern 120 may not affect the fine pattern layer 150.

As another method for rearranging the elements of the material layer 150x by the phase separation of the material layer 150x, the resulting structure including the material layer 150x may be retained in a chamber that is maintained at an atmosphere saturated with toluene vapor.

Among the polymer blocks constituting the block copolymer of the material layer 150x, the polymer block having a higher polarity is self-aligned on the exposed portion of the phase separation guide layer 110 to cover the exposed portion of the phase separation guide layer 110. The first polymer block and the second polymer block are vertically oriented on the neutral pattern 120 so that the first and second polymer blocks are equidistantly and alternately disposed with a uniform width according to the molecular weight of the block copolymer and a width XGP of the guide pattern GP of the neutral pattern 120.

For example, when the first polymer block has a higher polarity than the second polymer block of the block copolymer of the material layer 150x, the first polymer block is self-aligned on the exposed portion of the phase separation guide layer 110 to form the first block 150a_1, as illustrated in FIG. 1I. Using the first block 150a_1 as a guide, the first block 150a_2 is equidistantly and repetitively disposed with a uniform width on the exposed surface of the neutral pattern 120. The second polymer block is self-aligned on the neutral pattern 120 alternately with the first polymer block while having the same width as the first polymer block, thereby forming the second block 150b. Herein, by the arrangement structure of the first block 150a and the second block 150b, a pattern having a predetermined or desired shape is formed in the fine pattern layer 150.

For example, when the block copolymer of the material layer 150x is a polystyrene-polymethylmethacrylate (PS-PMMA) block copolymer, the first block 150a addressed on the exposed portion of the phase separation guide layer 110 having a higher polarity than the neutral pattern 120 may be formed of PMMA having a higher hydrophile property and the second block 150b may be formed of PS. In the fine pattern layer 150, the first block 150a may have a width that is equal to the width XGP of the guide pattern GP of the neutral pattern 120.

The neutral layer 120X of the neutral pattern 120 has a relationship as given by Equation 1 with respect to the width XGP of the guide pattern GP.

$$120X = (2n+1) \cdot XGP \quad (n: \text{a positive integer}) \qquad \text{Equation 1}$$

For example, when n=1, the first block 150a_1 is disposed on the top surface of the phase separation guide layer 110 exposed by the guide pattern GP, and the second block 150b, the first block 150a_2, and the second block 150b are sequentially disposed on the top surface of the neutral pattern 120.

In the fine pattern forming method described with reference to FIGS. 1A to 1I, the case of n=1 is exemplarily described; however, the inventive concepts may also be similarly applied to the cases of n=2, 3, 4, . . . .

FIGS. 2A to 2E are sequential cross-sectional views illustrating a method of forming a fine pattern, according to another example embodiment of the inventive concepts. In FIGS. 2A to 2E, like reference numerals as in FIGS. 1A to 1I denote like elements, and redundant descriptions thereof will be omitted herein for simplicity.

Figure 2A:
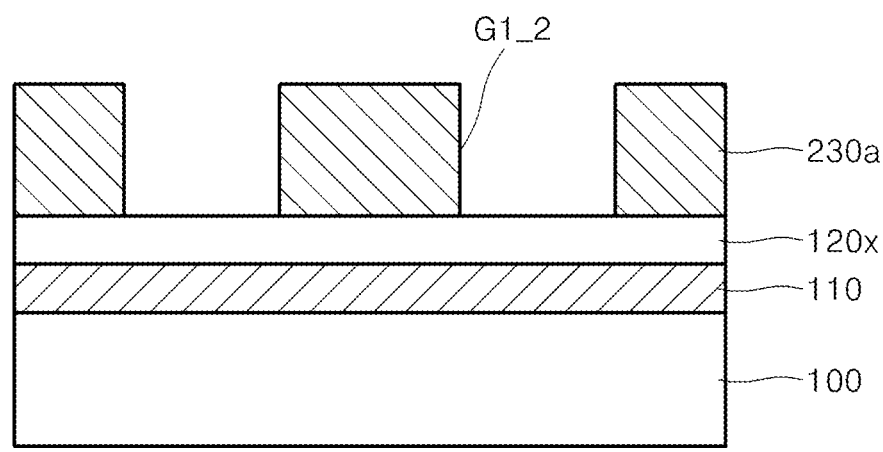
FIGS. 2A to 2E are sequential cross-sectional views illustrating a method of forming a fine pattern, according to another example embodiment of the inventive concepts.

Referring to FIG. 2A, a phase separation guide layer 110 and a neutral layer 120x are sequentially formed on a substrate 100 in the same manner as described with reference to FIGS. 1A to 1I, and then a first pattern 230a including a plurality of first openings G1_2 is formed on the neutral layer 120x.

After forming the first pattern 230a, a portion of the neutral layer 120x is exposed through the plurality of first openings G1_2 of the first pattern 230a. The planar shape of the first opening G1_2 of the first pattern 230a may be any one selected from a circular hole, an elliptical hole, a polygonal hole, a straight line, and a curved line.

Figure 2B:
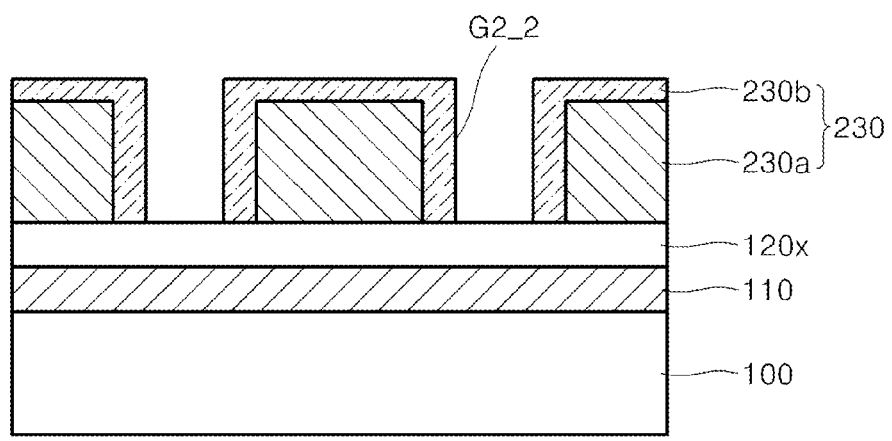

Referring to FIG. 2B, a capping layer 230b is formed on an exposed surface including a sidewall and a top surface of the first pattern 230a to form a second pattern 230 including a plurality of second openings G2_2.

The capping layer 230b includes an acid source formed of an acid or a potential acid. For example, the capping layer 230b may be formed of a mixture of a polymer and the acid source.

The potential acid of the capping layer 230b may be, for example, any one selected from a perfluorobutane sulfonic acid (PFBS), a trifluoroacetic acid (TFA), and a trifluoromethane sulfonic acid (TFMSA).

Alternatively, the potential acid of the capping layer 230b may include, for example, a chromophore group and may be a first PAG that generates an acid when exposed to any light selected from a KrF excimer laser, an ArF excimer laser, and a F2 excimer laser. In an example embodiment, the first PAG may be formed of triarylsulfonium salts, diaryliodonium salts, sulfonates, or any mixture thereof. For example, the first PAG may be formed of triphenylsulfonium triflate, triphenylsulfonium antimonate, diphenyliodonium triflate, diphenyliodonium antimonate, methoxydiphenyliodonium triflate, di-t-butyldiphenyliodonium triflate, 2,6-dinitrobenzyl sulfonates, pyrogallol tris(alkylsulfonates), N-hydroxysuccinimide triflate, norbornene-dicarboximide-triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene-dicarboximide-nonaflate, triphenylsulfonium perfluorobutanesulfonate, triphenylsulfonium perfluorooctanesulfonate (PFOS), diphenyliodonium PFOS, methoxydiphenyliodonium PFOS, di-t-butyldiphenyliodonium triflate, N-hydroxysuccinimide PFOS, norbornene-dicarboximide PFOS, or any mixture thereof.

Alternatively, the potential acid of the capping layer 230b may be, for example, a thermoacid generator (TAG) that generates an acid by heat. The TAG may be formed of a aliphatic or alicyclic compound. For example, the TAG may be formed of at least one compound selected from the group consisting of carbonate ester, sulfonate ester, and phosphate ester. For example, the TAG may be formed of at least one compound selected from the group consisting of cyclohexyl nonafluorobutanesulfonate, norbornyl nonafluorobutanesulfonate, tricyclodecanyl nonafluorobutanesulfonate, adamantyl nonafluorobutanesulfonate, cyclohexyl nonafluorobutanecarbonate, norbornyl nonafluorobutanecarbonate, tricyclodecanyl nonafluorobutanecarbonate, adamantyl nonafluorobutanecarbonate, cyclohexyl nonafluorobutanephosphonate, norbornyl nonafluorobutanephosphonate, tricyclodecanyl nonafluorobutanephosphonate, and adamantyl nonafluorobutanephosphonate.

When the capping layer 230b is formed of a mixture of a polymer and the acid source, the acid source may be about 0.01 wt % to about 50 wt % with respect to the total weight of the polymer.

The polymer that may be included in the capping layer 230b may comprise a water-soluble polymer. The water-soluble polymer may include, for example, at least one monomer unit selected from an acrylamide type monomer unit, a vinyl type monomer unit, an alkylen glycol type monomer unit, a maleic anhydride monomer unit, an ethylene imine monomer unit, an oxazoline group-containing monomer unit, an acrylonitrile monomer unit, an ally amide monomer unit, a 3,4-dihydropyran monomer unit, or a 2,3-dihydrofuran monomer unit.

As an example method for forming the capping layer 230b, a capping composition formed of a mixture of water, a water-soluble polymer, and an acid source formed of a water-soluble acid or a potential acid may be coated on the exposed surface of the first pattern 230a and then the resulting structure may be heat-treated.

As another example method for forming the capping layer 230b, any one of the above-described acid sources may be mixed with a RELACS™ (Resolution Enhancement Lithography Assisted by Chemical Shrink) material, a mixture thereof may be coated on the exposed surface of the first pattern 230a, and then the resulting structure may be baked under a predetermined or desired temperature for a predetermined or desired time, for example, under a temperature of about 100° C. to about 130° C. for about 20 seconds to about 70 seconds. In an example embodiment, the acid remaining on the surface of the first pattern 230a may act as a catalyst, and that the RELACS™ material may be bridged on the surface of the first pattern 230a to form the capping layer 230b. After the forming of the capping layer 230b, the unnecessary coating composition remaining on the capping layer 230b may be removed using any solvent selected from water, an organic solvent, a mixture of water and an organic solvent, or a developer.

Figure 2C:
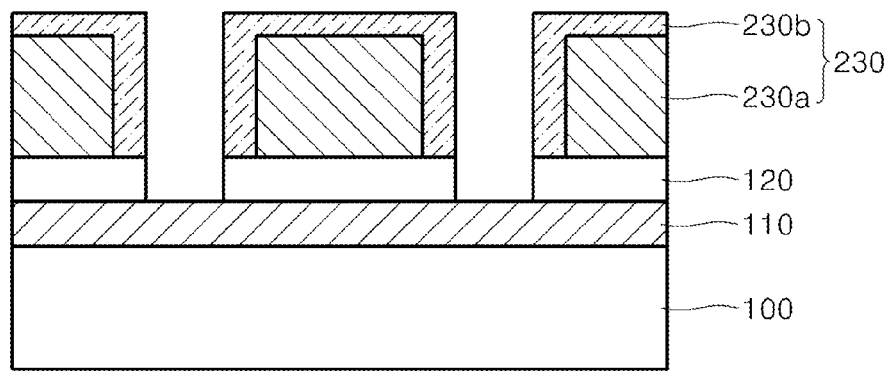

Referring to FIG. 2C, a neutral pattern 120 is formed by etching the neutral pattern 120 by using the second pattern 230 as an etch mask. The neutral pattern 120 may be formed in the same manner as described with reference to FIG. 1F.

Figure 2D:
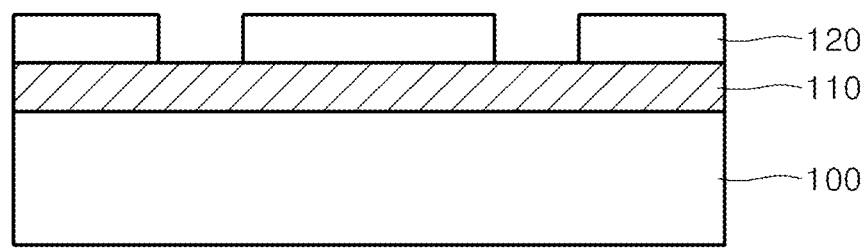

Referring to FIG. 2D, the second pattern 230 used as the etch mask is removed to expose the top surface of the neutral pattern 120.

In some example embodiments, the second pattern 230 may be removed by stripping the first pattern 230a and the capping layer 230b simultaneously. In other example embodiments, the second pattern 230 may be removed by stripping the capping layer 230b and then stripping the first pattern 230a.

The second pattern 230 may be removed by a stripping process using a general solvent or thinner. In some example embodiments, the second pattern 230 may be removed by using an organic solvent such as PGMEA, PGME, or EL, and an alkali solvent such as TMAH, depending on the composition of the second pattern 230.

Figure 2E:
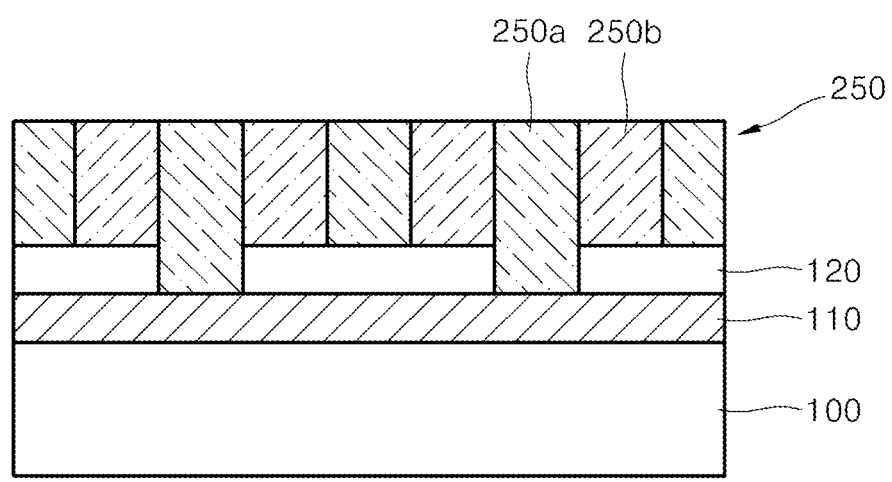

Referring to FIG. 2E, a material layer 150x (see FIG. 1H) is formed on a top surface of the neutral pattern 120 and an exposed top surface of the phase separation guide layer 110. Thereafter, the elements of the material layer 150x are rearranged by the phase separation of the material layer 150x to form a fine pattern layer 150 including a first block 250a and a second block 250b formed of monomer units of different elements. The neutral pattern 250 may be formed in the same manner as described with reference to FIG. 1I.

Figure 3A:
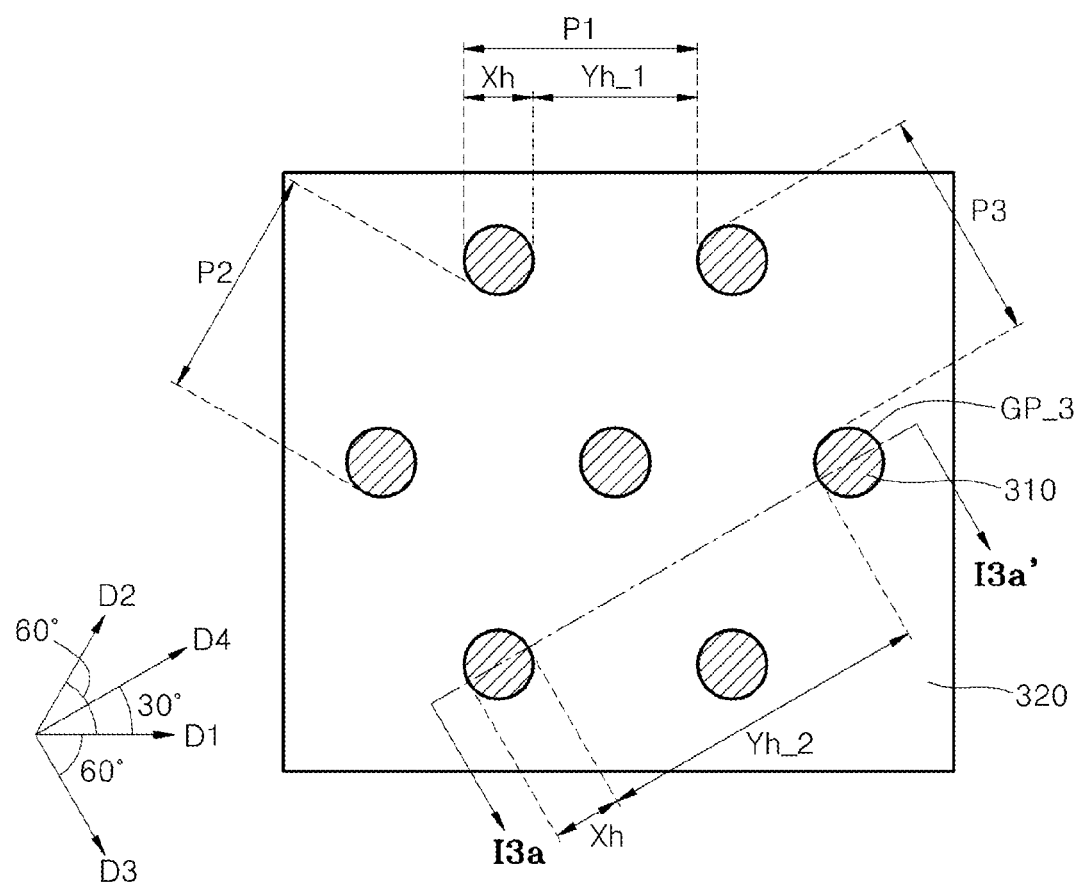
FIGS. 3A and 3C are plan views illustrating a method of forming a fine pattern, according to another example embodiment of the inventive concepts.
Figure 3B:
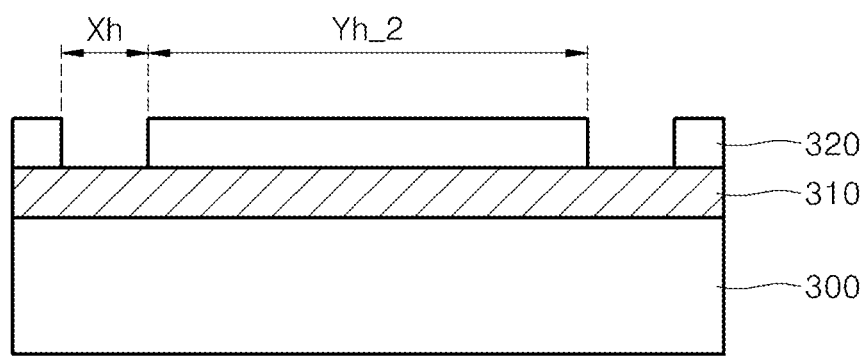
FIG. 3B is a cross-sectional view taken along the line 13a-13a' of FIG. 3A.
Figure 3C:
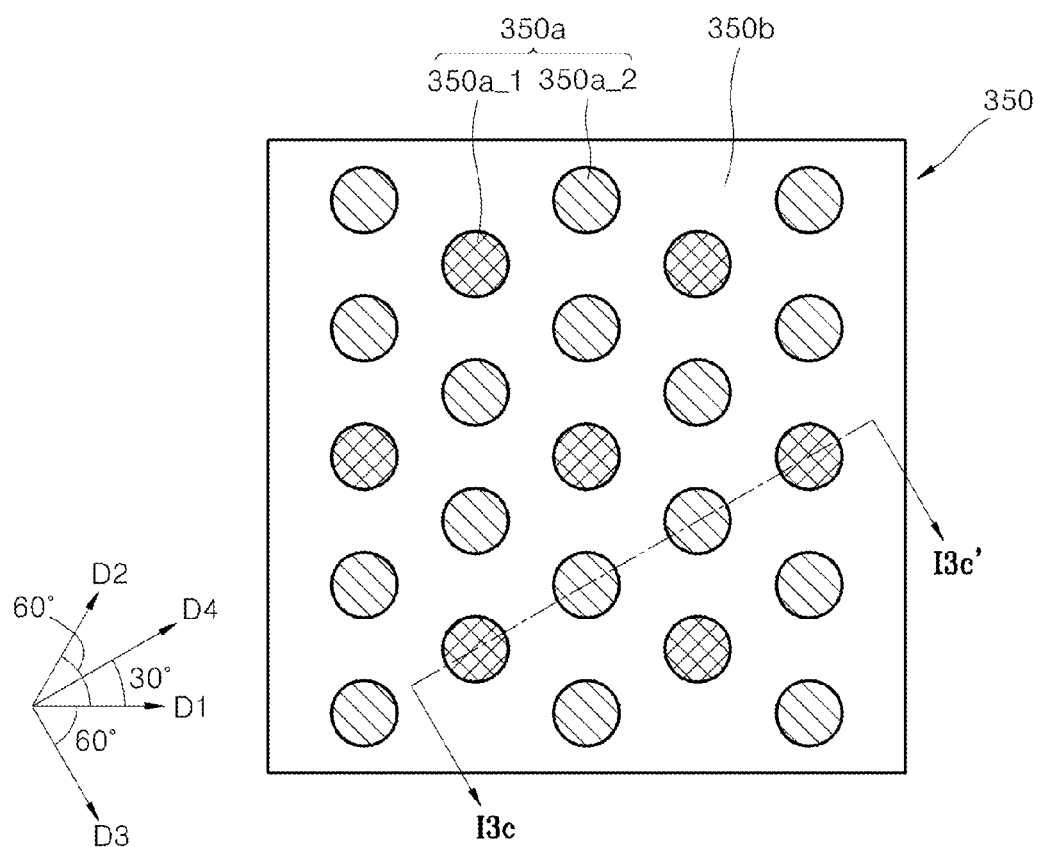
Figure 3D:
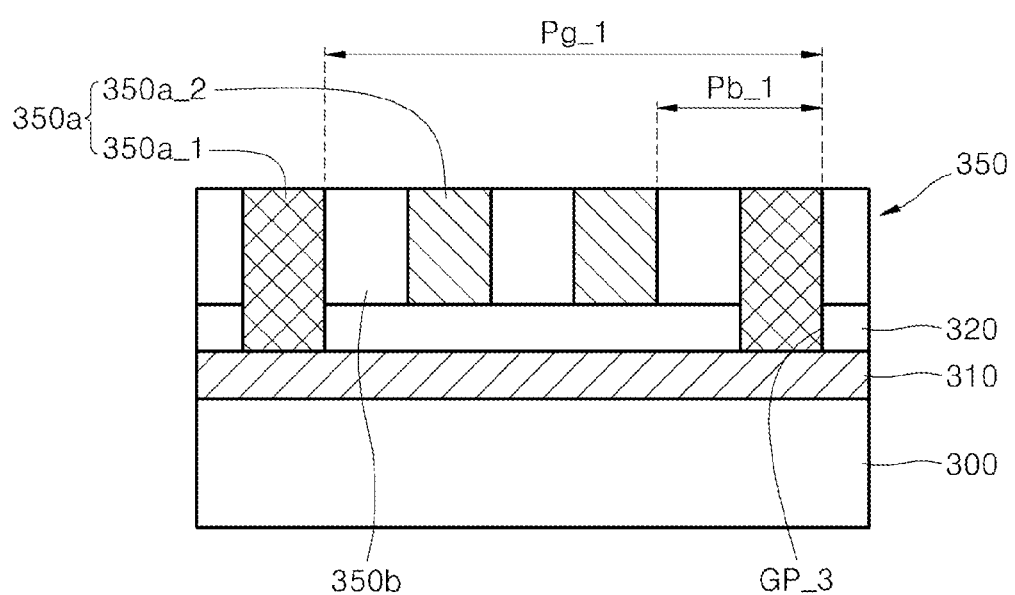
FIG. 3D is a cross-sectional view taken along the line 13c-13c' of FIG. 3C.

FIGS. 3A and 3C are plan views illustrating a method of forming a fine pattern, according to another example embodiment of the inventive concepts. FIG. 3B is a cross-sectional view taken along a line I3a-I3a' of FIG. 3A. FIG. 3D is a cross-sectional view taken along a line I3c-I3c' of FIG. 3C.

In FIGS. 3A and 3B, first to fourth directions D1, D2, D3, and D4 are located on one plane, the second direction D2 is at an angle of about 60° with respect to the first direction D1 in the counter clockwise direction, the third direction D3 is at an angle of about 60° with respect to the first direction D1 in the clockwise direction, and the fourth direction D4 is at an angle of about 30° with respect to the first direction D1 in the counter clockwise direction.

Referring to FIGS. 3A and 3B, a phase separation guide layer 310 and a neutral pattern 320 are sequentially formed on a substrate 100 in the same manner as described with reference to FIGS. 1A to 1I.

As illustrated in FIG. 3A, a plurality of guide patterns GP_3 of the neutral pattern 320 are of a hole type and are repetitively formed at a predetermined or desired pitch in a radial direction at an interval of a selected angle around any one of the plurality of guide patterns GP_3. The plurality of guide patterns GP_3 are repetitively formed at an interval of about 60°, but are not limited thereto. Accordingly, the plurality of guide patterns GP_3 are repetitively formed at a predetermined or desired pitch in the first direction D1, the second direction D2, and the third direction D3. That is, a pitch P1 in the first direction D1, a pitch P2 in the second direction D2, and a pitch P3 in the third direction D3 are equal to each other. Accordingly, the plurality of guide patterns GP_3 of the neutral pattern 320 have a honeycomb structure in a plan view according to an example embodiment of the inventive concepts.

In some example embodiments, when the width of each of the plurality of guide patterns GP_3 having a honeycomb structure in the first direction D1 is Xh, a first width Yh_1 of the neutral pattern 320 in the first direction D1 and a second width Yh_2 of the neutral pattern 320 in the fourth direction D4 have a relationship as given by Equations 2 and 3 with respect to the width Xh of the guide pattern GP_3.

$$Yh\_1 = (2\sqrt{3}-1) \cdot Xh \qquad \text{Equation 2}$$

$$Yh\_2 = 5 \cdot Xh \qquad \text{Equation 3}$$

Accordingly, a distance between two guide patterns disposed in the radial direction at an interval, which is about two times greater than the selected angle, around any one of the plurality of guide patterns GP_3 may be about five times the width Xh of the guide pattern GP_3.

For example, when the width Xh of the guide pattern GP_3 is about 25 nm, the first width Yh_1 of the neutral pattern 320 in the first direction D1 may be about 61.6 nm and the second width Yh_2 of the neutral pattern 320 in the fourth direction D4 may be about 125 nm.

In an example embodiment, since the pitch P1 in the first direction D1, the pitch P2 in the second direction D2, and the pitch P3 in the third direction D3 are equal to each other, the widths of the neutral pattern 320 in the second direction D2 and the third direction D3 are equal to the first width Yh_1 in the first direction D1.

Referring to FIGS. 3C and 3D, a material layer 150x (see FIG. 1H) is formed on a top surface of the neutral pattern 320 and an exposed top surface of the phase separation guide layer 310. Thereafter, the elements of the material layer 150x are rearranged by the phase separation of the material layer 150x to form a fine pattern layer 350 including a first block 350a and a second block 350b formed of monomer units of different elements. The volume ratio between the first block 350a and the second block 350b may be, for example, about 3:7.

The first block 350a and the second block 350b of the fine pattern layer 350 are disposed in a contact hole pattern.

In an example embodiment, a first block 350a_1 is disposed on the top surface of the phase separation guide layer 310 exposed by the plurality of guide pattern GP_3 of the neutral pattern 320. On the top surface of the neutral pattern 320, a first block 350a_2 is repetitively disposed at a first block pitch Pb_1 in the fourth direction D4 with respect to the first block 350a_1.

Since the second block 350b is disposed adjacent to the first block 350a, the second block 350b is disposed to extend continuously in the plan view of FIG. 3C.

In some example embodiments, a plurality of guide patterns among the plurality of guide patterns GP_3 arranged in the fourth direction D4 are repetitively formed at a first guide pitch Pg_1, and a first block among the first block 350a of the fine pattern layer 350 arranged in the fourth direction D4 is repetitively disposed at a first block pitch Pb_1. Herein, the first guide pitch Pg_1 and the first block pitch Pb_1 have a relationship as given by Equation 4.

$$Pb\_1 = \tfrac{1}{3} \cdot Pg\_1 \qquad \text{Equation 4}$$

Figure 4A:
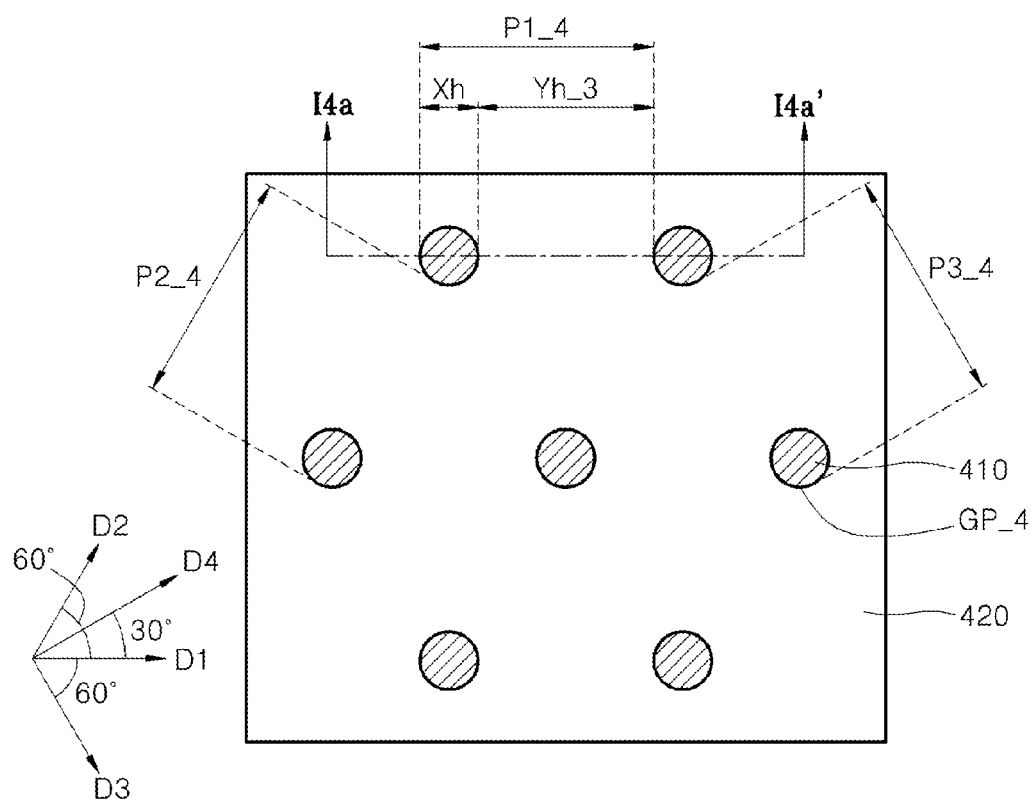
FIGS. 4A and 4C are plan views illustrating a method of forming a fine pattern, according to another example embodiment of the inventive concepts.
Figure 4B:
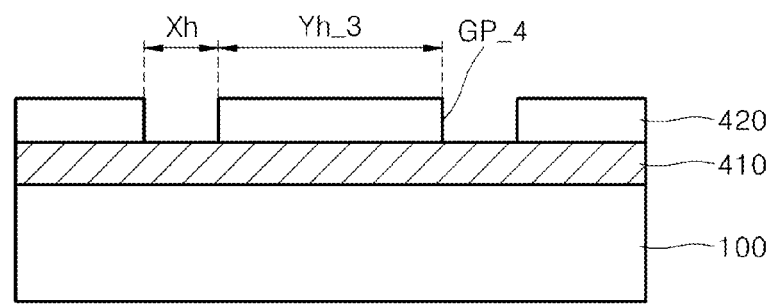
FIG. 4B is a cross-sectional view taken along the line 14a-14a' of FIG. 4A.
Figure 4C:
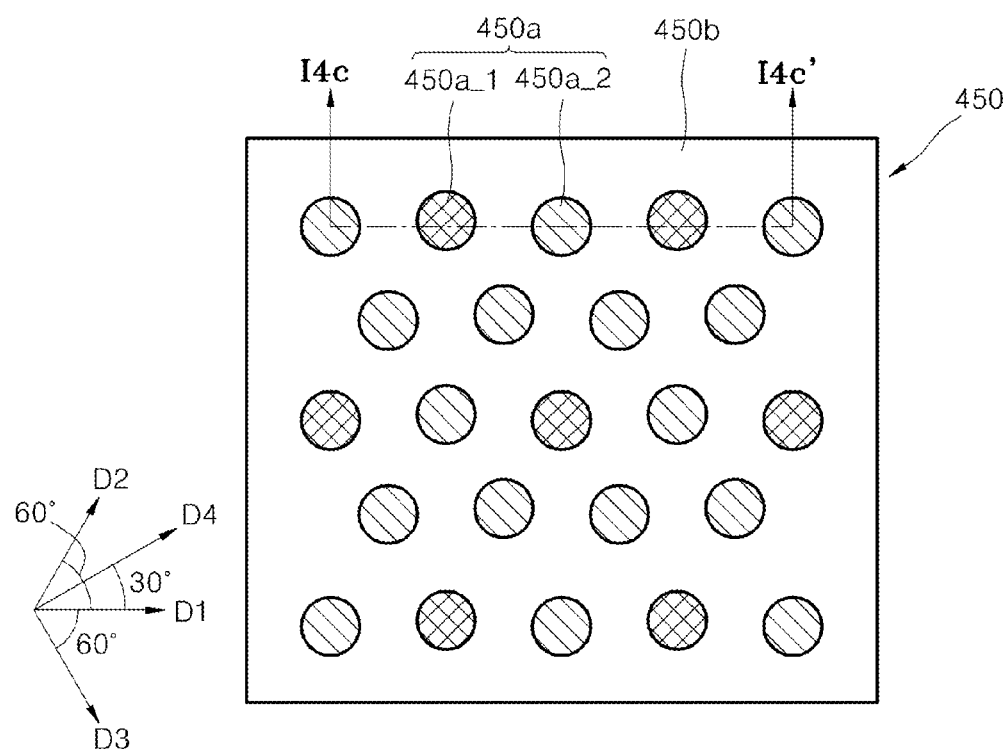
Figure 4D:
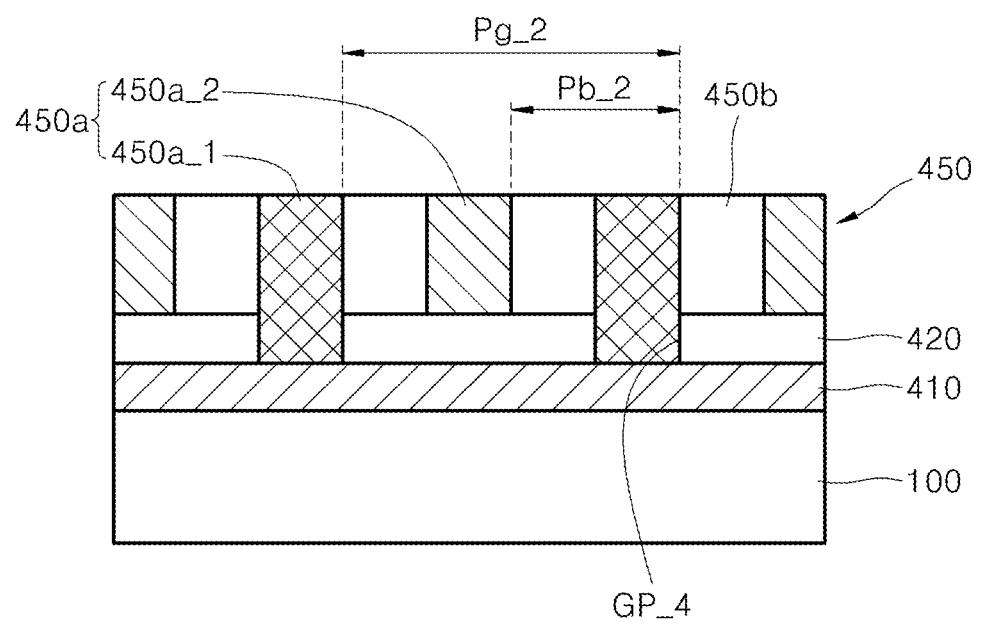
FIG. 4D is a cross-sectional view taken along the line 14c-14c' of FIG. 4C.

FIGS. 4A and 4C are plan views illustrating a method of forming a fine pattern, according to another example embodiment of the inventive concepts. FIG. 4B is a cross-sectional view taken along a line I4a-I4a' of FIG. 4A. FIG. 4D is a cross-sectional view taken along the line I4c-I4c' of FIG. 4C.

Referring to FIGS. 4A and 4B, a phase separation guide layer 410 and a neutral pattern 420 are formed on a substrate 100 in the same manner as described with reference to FIGS. 1A to 1I.

As illustrated in FIG. 4A, a plurality of guide patterns GP_4 of the neutral pattern 420 are of a hole type and are repetitively formed at a predetermined or desired pitch in a radial direction at an interval of a selected angle around any one of the plurality of guide patterns GP_4. The plurality of guide patterns GP_4 are repetitively formed at an interval of about 60°, but are not limited thereto. Accordingly, the plurality of guide patterns GP_4 are repetitively formed at a predetermined or desired pitch in the first direction D1, the second direction D2, and the third direction D3. That is, a pitch P1_4 in the first direction D1, a pitch P2_4 in the second direction D2, and a pitch P3_4 in the third direction D3 are equal to each other. Accordingly, the plurality of guide patterns GP_4 of the neutral pattern 420 have a honeycomb structure in the plan view of FIG. 4A.

In some example embodiments, when the width of each of the plurality of guide patterns GP_4 having a honeycomb structure is Xh, a third width Yh_3 of the neutral pattern 420 in the first direction D1 has a relationship as given by Equation 5 with respect to the width Xh of the guide pattern GP_4 in the first direction D1.

$$Yh\_3 = (2n+1) \cdot Xh \qquad \text{Equation 5}$$

Accordingly, a distance between two guide patterns disposed in the radial direction at an interval of the selected angle around any one of the plurality of guide patterns GP_4 may be about (2n+1) times the width Xh of the guide pattern GP_4, where n is a positive integer.

For example, when n=1, and when the width Xh of the guide pattern GP_4 is about 25 nm, the third width Yh_3 of the neutral pattern 420 in the first direction D1 may be about 75 nm.

In an example embodiment, since the pitch P1_4 in the first direction D1, the pitch P2_4 in the second direction D2, and the pitch P3_4 in the third direction D3 are equal to each other, the widths of the neutral pattern 420 in the second direction D2 and the third direction D3 are equal to the third width Yh_3 in the first direction D1.

Referring to FIGS. 4C and 4D, a fine pattern layer 450 including a first block 450a and a second block 450b is formed on a top surface of the neutral pattern 420 and an exposed top surface of the phase separation guide layer 410.

The volume ratio between the first block 450a and the second block 450b may be, for example, about 3:7.

The first block 450a and the second block 450b of the fine pattern layer 450 are disposed in a contact hole pattern.

In an example embodiment, a first block 450a_1 is disposed on the top surface of the phase separation guide layer 410 exposed by the plurality of guide patterns GP_4 of the neutral pattern 420. On the top surface of the neutral pattern 420, a first block 450a_2 is repetitively disposed at a second block pitch Pb_2 in the fourth direction D4 with respect to the first block 450a_1.

Since the second block 450b is disposed adjacent to the first block 450a, the second block 450b is disposed to extend continuously in the plan view of FIG. 4C.

In some example embodiments, a plurality of guide patterns among the plurality of guide patterns GP_4 arranged in the first direction D1 are repetitively formed at a second guide pitch Pg_2, and a first block among the first block 450a of the fine pattern layer 450 arranged in the first direction D1 is repetitively disposed at a second block pitch Pb_2. Herein, the second guide pitch Pg_2 and the second block pitch Pb_2 have a relationship as given by Equation 6.

$$Pb\_2=\{1/(n+1)\}\cdot Pg\_2 \ (n: \text{a positive integer}) \qquad \text{Equation 6}$$

In the fine pattern forming method described with reference to FIGS. 4A to 4D, the case of n=1 is exemplarily described; however, the inventive concepts may also be similarly applied to the cases of n=2, 3, 4, . . . .

Figure 5A:
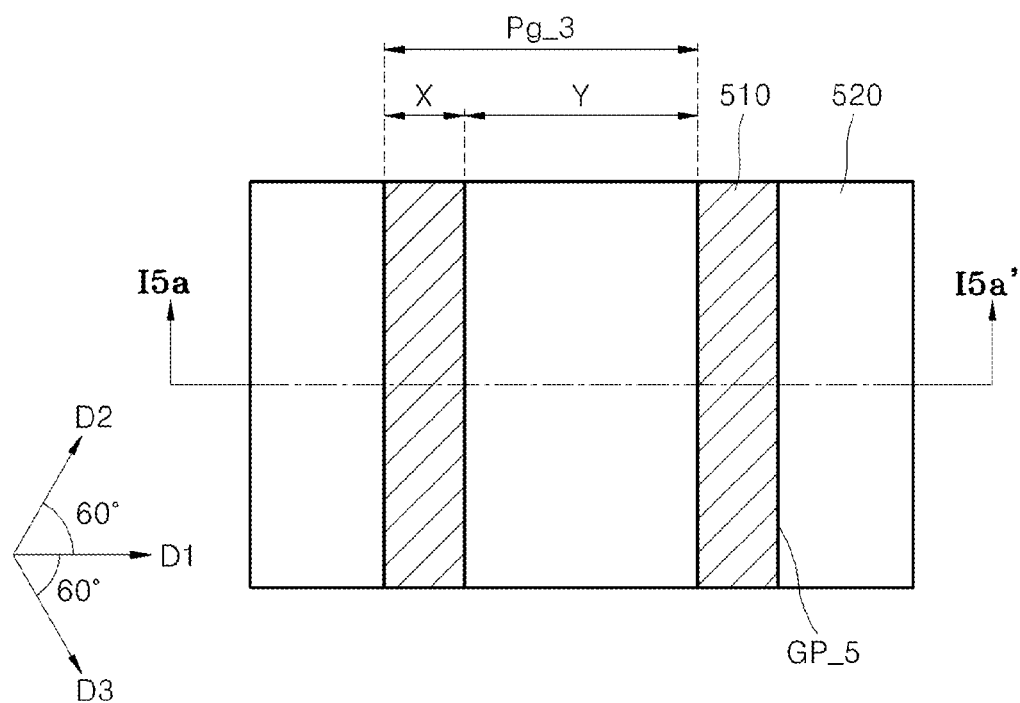
FIGS. 5A and 5C are plan views illustrating a method of forming a fine pattern, according to another example embodiment of the inventive concepts.
Figure 5B:
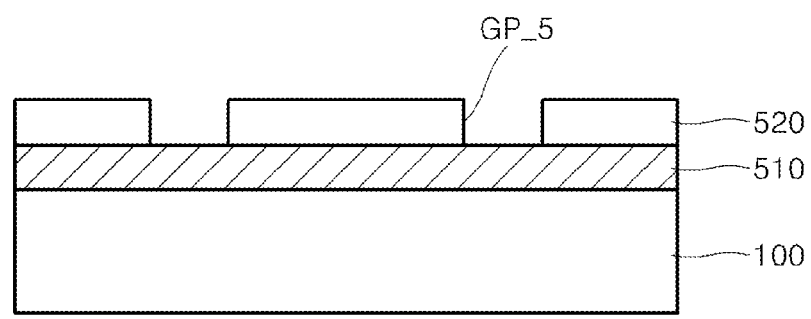
FIG. 5B is a cross-sectional view taken along the line 15a-15a' of FIG. 5A.
Figure 5C:
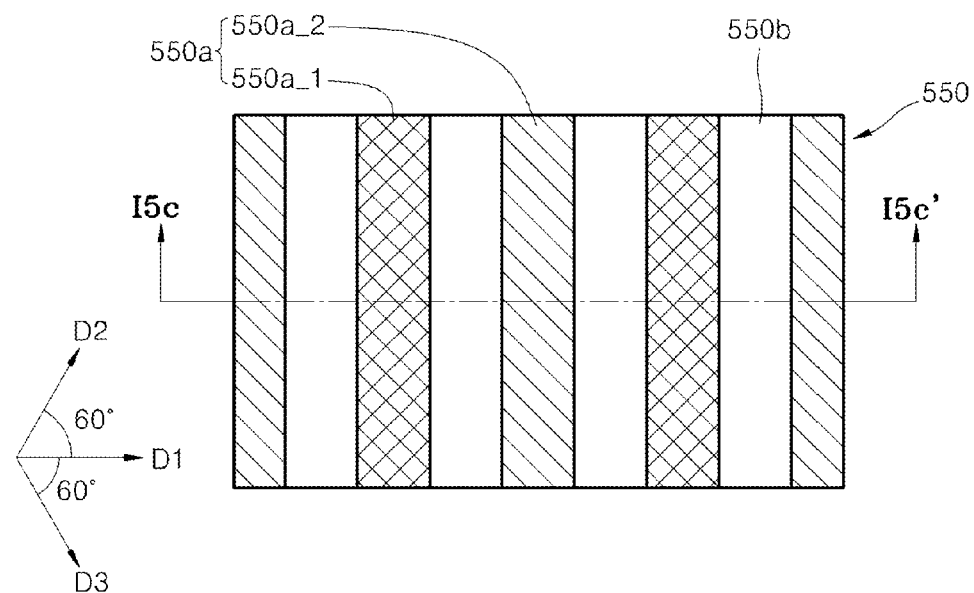
Figure 5D:
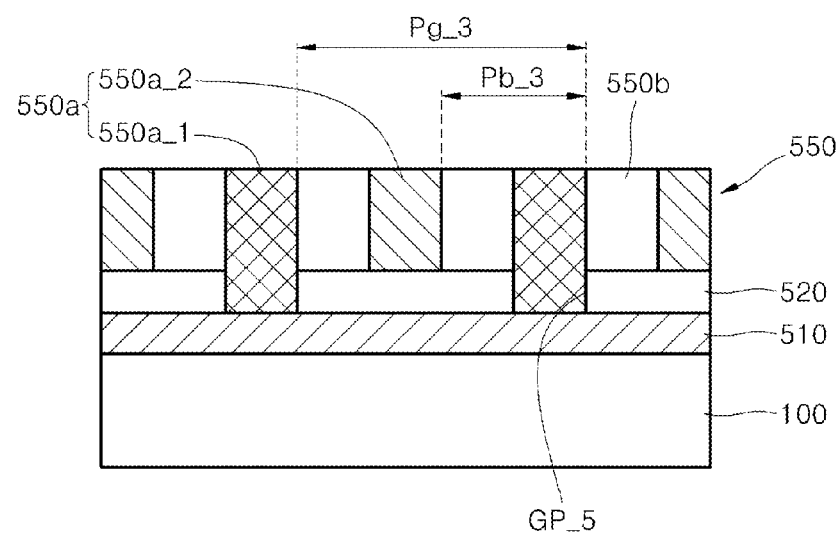
FIG. 5D is a cross-sectional view taken along the line 15c-15c' of FIG. 5C.

FIGS. 5A and 5C are plan views illustrating a method of forming a fine pattern, according to another example embodiment of the inventive concepts. FIG. 5B is a cross-sectional view taken along the line I5a-I5a' of FIG. 5A. FIG. 5D is a cross-sectional view taken along the line I5c-I5c' of FIG. 5C.

Referring to FIGS. 5A and 5B, a phase separation guide layer 510 and a neutral pattern 520 are formed on a substrate 100 in the same manner as described with reference to FIGS. 1A to 1I.

As illustrated in FIG. 5A, a plurality of guide patterns GP_5 of the neutral pattern 520 are of a line type and are repetitively formed at a predetermined or desired pitch in the first direction D1.

In some example embodiments, when the width of each of the plurality of guide patterns GP_5 is X, a width Y of the neutral pattern 520 in the first direction D1 has a relationship as given by Equation 7 with respect to the width X of the guide pattern GP_5 in the first direction D1.

$$Y=(2n+1)\cdot X \ (n: \text{a positive integer}) \qquad \text{Equation 7}$$

For example, when n=1, and when the width X of the guide pattern GP_5 is about 16.9 nm, the width Y of the neutral pattern 520 in the first direction D1 may be about 50.7 nm.

Referring to FIGS. 5C and 5D, a fine pattern layer 550 including a first block 550a and a second block 550b is formed on a top surface of the neutral pattern 520 and an exposed top surface of the phase separation guide layer 510. The volume ratio between the first block 550a and the second block 550b may be, for example, about 1:1.

The first block 550a and the second block 550b of the fine pattern layer 550 are disposed in a line and space pattern.

In an example embodiment, a first block 550a_1 is disposed on the top surface of the phase separation guide layer 510 exposed by the plurality of guide pattern GP_5 of the neutral pattern 520. On the top surface of the neutral pattern 520, a second block 550b and a first block 550a_2 are sequentially disposed adjacent to the first block 550a_1. Accordingly, the first block 550a and the second block 550b of the fine pattern layer 550 are disposed at a third block pitch Pb_3 in the first direction D1 to form a line and space pattern.

In some example embodiments, the plurality of guide patterns GP_5 are repetitively formed at a third guide pitch Pg_3 in the first direction D1, and the first block 550a and the second block 550b of the fine pattern layer 550 are repetitively disposed at a third block pitch Pb_3 in the first direction D1. Herein, the third guide pitch Pg_3 and the third block pitch Pb_3 have a relationship as given by Equation 8.

$$Pb\_3=\{1/(n+1)\}\cdot Pg\_3 \ (n: \text{a positive integer}) \qquad \text{Equation 8}$$

In the fine pattern forming method described with reference to FIGS. 5A to 5D, the case of n=1 is exemplarily described; however, the inventive concepts may also be similarly applied to the cases of n=2, 3, 4, . . . .

Figure 6A:
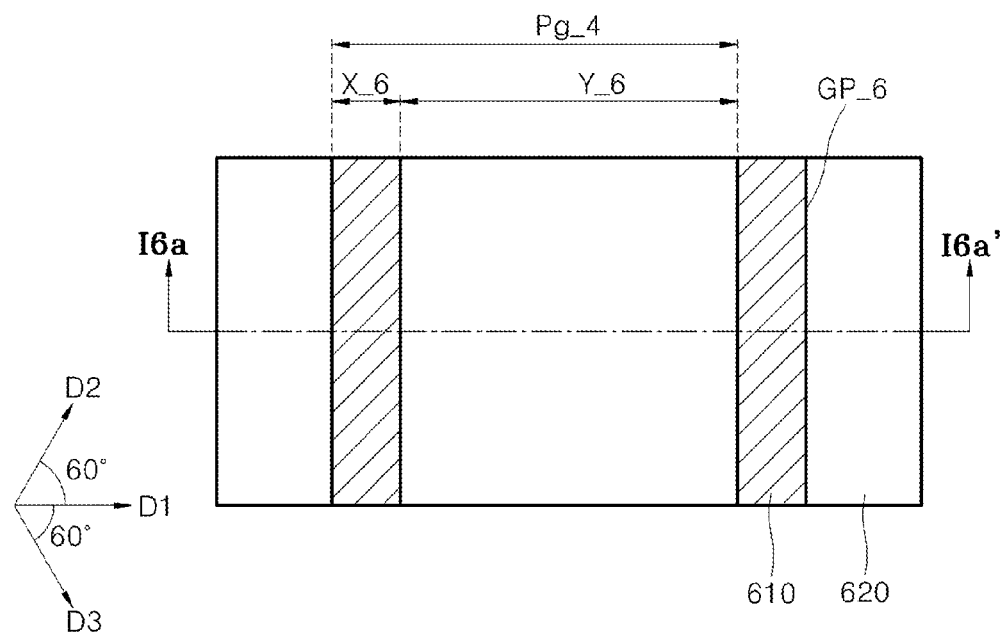
FIGS. 6A and 6C are plan views illustrating a method of forming a fine pattern, according to another example embodiment of the inventive concepts.
Figure 6B:
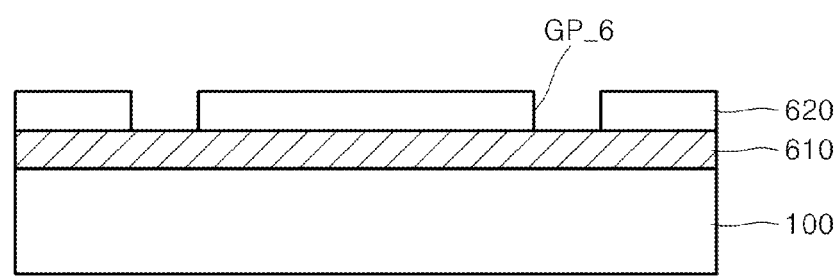
FIG. 6B is a cross-sectional view taken along the line 16a-16a' of FIG. 6A.
Figure 6C:
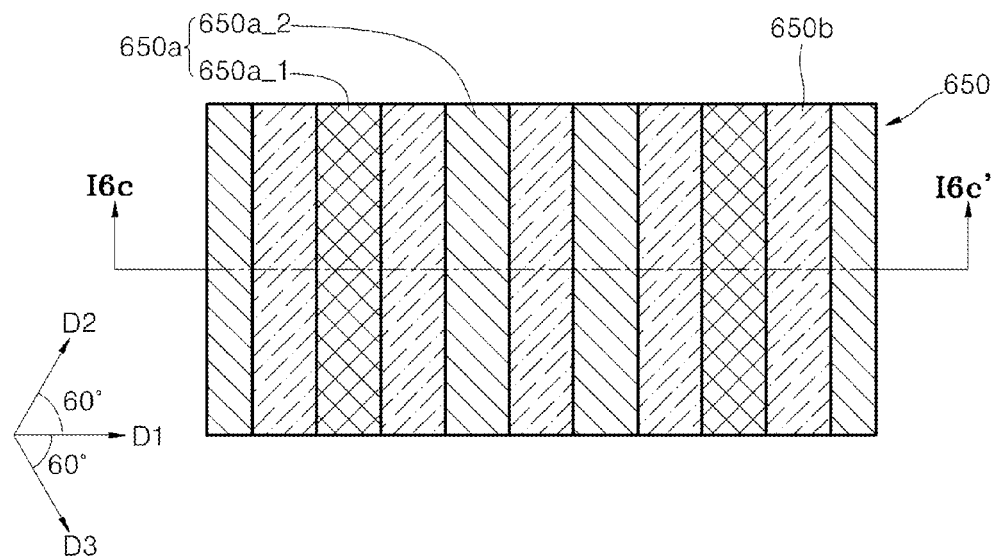
Figure 6D:
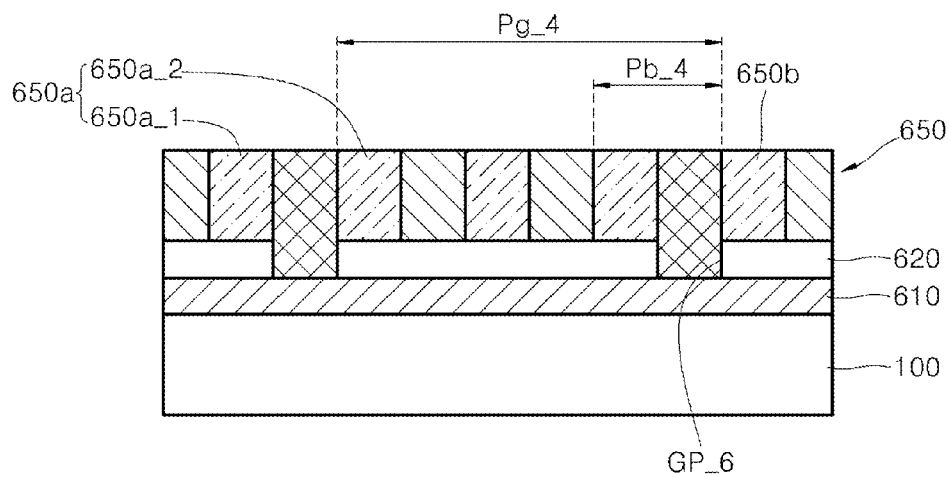
FIG. 6D is a cross-sectional view taken along the line 16c-16c' of FIG. 6C.

FIGS. 6A and 6C are plan views illustrating a method of forming a fine pattern, according to another example embodiment of the inventive concepts. FIG. 6B is a cross-sectional view taken along the line I6a-I6a' of FIG. 6A. FIG. 6D is a cross-sectional view taken along the line I6c-I6c' of FIG. 6C.

Referring to FIGS. 6A and 6B, a phase separation guide layer 610 and a neutral pattern 620 are sequentially formed on a substrate 100 in the same manner as described with reference to FIGS. 1A to 1I.

As illustrated in FIG. 6A, a plurality of guide patterns GP_6 of the neutral pattern 620 are of a line type and are repetitively formed at a predetermined or desired pitch in the first direction D1.

According to Equation 7, when n=2, a width Y_6 of the neutral pattern 620 in the first direction D1 is about five times a width X_6 of the guide pattern GP_6. For example, when the width X_6 of the guide pattern GP_6 is about 16.9 nm, the width Y_6 of the neutral pattern 620 in the first direction D1 may be about 84.5 nm.

Referring to FIGS. 6C and 6D, a fine pattern layer 650 including a first block 650a and a second block 650b is formed on a top surface of the neutral pattern 620 and an exposed top surface of the phase separation guide layer 610. The volume ratio between the first block 650a and the second block 650b may be, for example, about 1:1.

The first block 650a and the second block 650b of the fine pattern layer 650 are disposed in a line and space pattern.

In an example embodiment, a first block 650a_1 is disposed on the top surface of the phase separation guide layer 610 exposed by the plurality of guide pattern GP_6 of the neutral pattern 620. On the top surface of the neutral pattern 620, a second block 650b and a first block 650a_2 are sequentially disposed adjacent to the first block 650a_1. Accordingly, the first block 650a and the second block 650b of the fine pattern layer 650 are disposed at a fourth block pitch Pb_4 in the first direction D1 to form a line and space pattern.

In some example embodiments, the plurality of guide patterns GP_6 are repetitively formed at a fourth guide pitch Pg_4 in the first direction D1, and the first block 650a and the second block 650b of the fine pattern layer 650 are repetitively disposed at a fourth block pitch Pb_4 in the first direction D1.

According to Equation 8, when n=2, the fourth guide pitch Pg_4 is about three times the fourth block pitch Pb_4.

FIGS. 7A to 7D are sequential cross-sectional views illustrating a method of forming a fine pattern, according to another example embodiment of the inventive concepts.

Figure 7A:
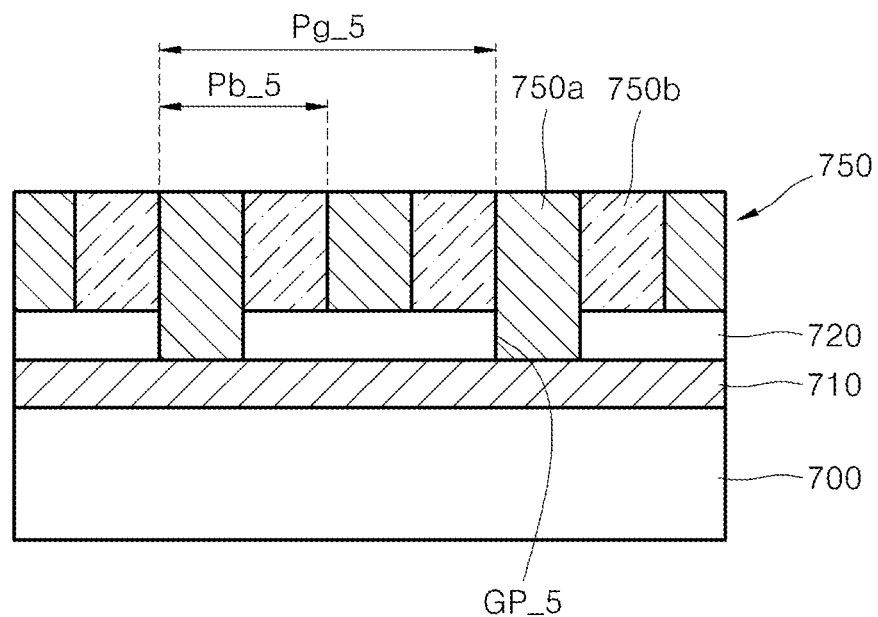
FIGS. 7A to 7D are sequential cross-sectional views illustrating a method of forming a fine pattern, according to another example embodiment of the inventive concepts.

Referring to FIG. 7A, a phase separation guide layer 710 and a neutral pattern 720 are sequentially formed on a substrate 700 in the same manner as described with reference to FIGS. 1A to 1I. The substrate 700, the phase separation guide layer 710, and the neutral pattern 720 may be respectively identical to the substrate 100, the phase separation guide pattern 110, and the neutral pattern 120 described with reference to FIGS. 1A to 1I.

Thereafter, a fine pattern layer 750 including a first block 750*a* and a second block 750*b* is formed on a top surface of the neutral pattern 720 and an exposed top surface of the phase separation guide layer 710.

The first block 750*a* and the second block 750*b* of the fine pattern layer 750 may be disposed in a contact hole pattern or in a line and space pattern.

Figure 7B:
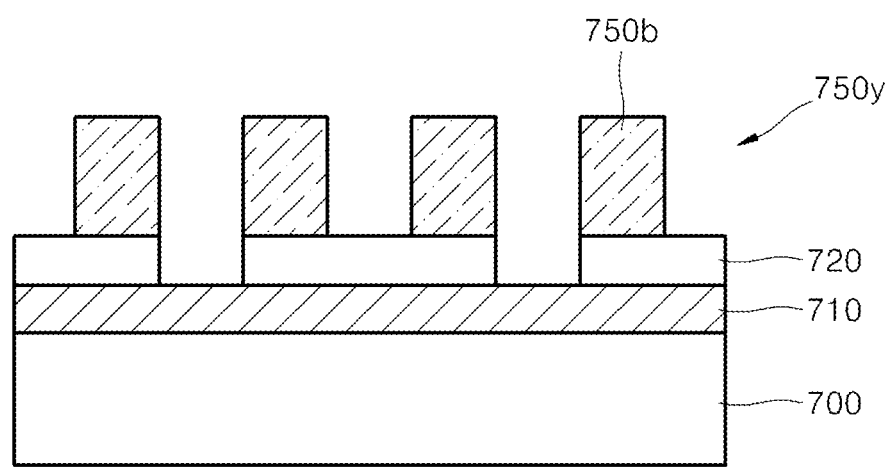

Referring to FIG. 7B, any one of the first block 750*a* and the second block 750*b* is removed from the fine pattern layer 750 to form a fine mask pattern 750*y*.

FIG. 7B illustrates a case where the first block 750*a* is removed to form a fine mask pattern 750*y* that exposes a portion of the top surface of the neutral pattern 720 and the exposed portion of the phase separation guide layer 710. However, the inventive concepts are not limited thereto, and the second block 750*b* may be removed to form a fine mask pattern. To remove any one of the first block 750*a* and the second block 750*b*, for example, a target block to be removed may be photolyzed by irradiating an ultraviolet (UV) onto the target block or exposing the target block to oxygen plasma, and then the photolyzed portion may be stripped by using a cleaning solution.

Figure 7C:
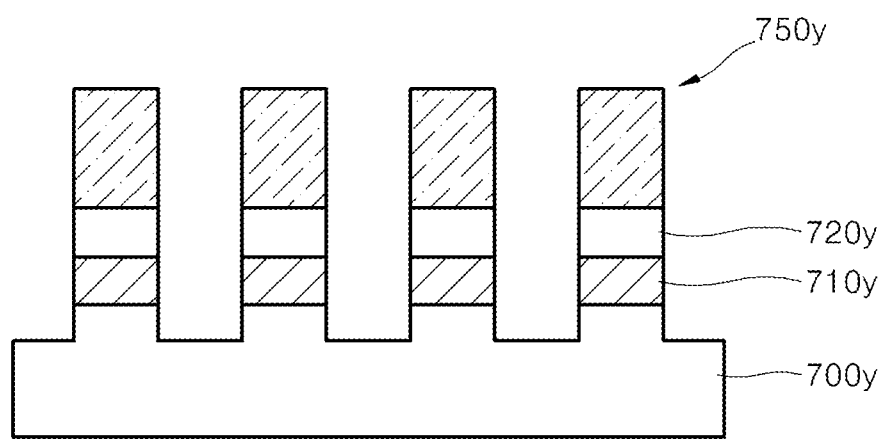

Referring to FIG. 7C, by using the fine mask pattern 750*y* as an etch mask, the exposed portion of the phase separation guide layer 710, the exposed portion of the neutral pattern 720, and the phase separation guide layer 710 thereunder are etched, and then the substrate 700 is etched to form a patterned substrate 700*y*.

Figure 7D:
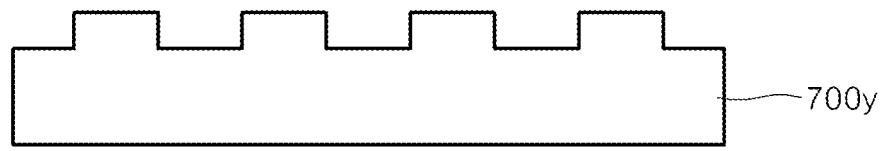

Referring to FIG. 7D, the fine mask pattern 750*y* is removed, and the unnecessary films remaining on the patterned substrate 700*y* are removed.

The fine pattern formed on the patterned substrate 700*y* may be repetitively formed at a pitch Pb_5 that is about the half of a pitch Pg_5 of a guide pattern GP5 formed in the neutral pattern 720. Thus, the patterned substrate 700*y* has a density that is about two times the density of the guide pattern GP_5 formed in the neutral pattern 720.

FIGS. 8A to 8D are sequential cross-sectional views illustrating a method of forming a fine pattern, according to another example embodiment of the inventive concepts.

Figure 8A:
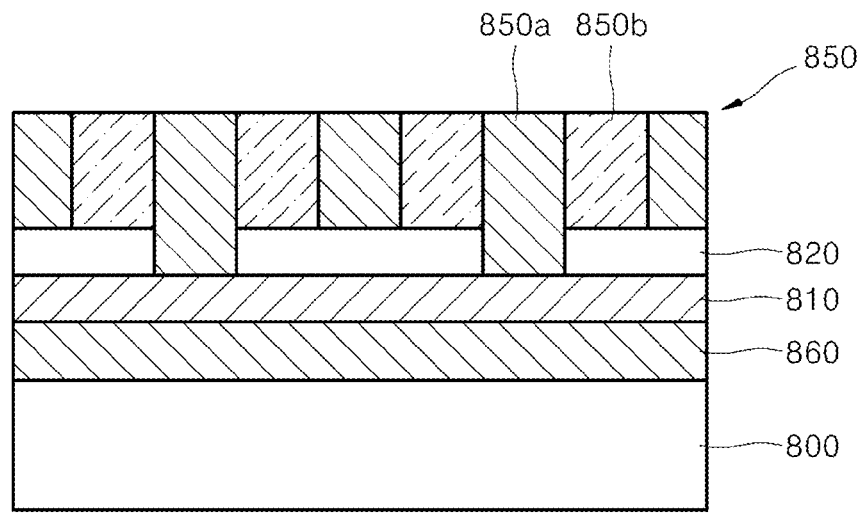
FIGS. 8A to 8D are sequential cross-sectional views illustrating a method of forming a fine pattern, according to another example embodiment of the inventive concepts.

Referring to FIG. 8A, an etching target film 860 is formed on a substrate 800.

The substrate 800 may be identical to the substrate 100 described with reference to FIG. 1A. The etching target film 860 may be an insulating film, a semiconductor film, a metal film, or a metal silicide film. In an example embodiment, the etching target film 860 may be an insulating film such as an oxide film, a nitride film, or an oxynitride film, a semiconductor film such as a polysilicon film or an amorphous silicon film, a metal film such as an aluminium (Al) film, a tungsten (W) film, a gold (Au) film, a silver (Ag) film, a palladium (Pd) film, or a copper (Cu) film, or a metal silicide film such as a tungsten silicide film, a cobalt silicide film, or a nickel silicide film.

After the forming of the etching target film 860, a phase separation guide layer 810 and a neutral pattern 820 are sequentially formed on the etching target film 860 in the same manner as described with reference to FIGS. 1A to 1I. The phase separation guide layer 810 and the neutral pattern 820 may be respectively identical to the phase separation guide pattern 110 and the neutral pattern 120 described with reference to FIGS. 1A to 1I.

A fine pattern layer 850 including a first block 850*a* and a second block 850*b* is formed on a top surface of the neutral pattern 820 and an exposed top surface of the phase separation guide layer 810.

The first block 850*a* and the second block 850*b* of the fine pattern layer 850 may be disposed in a contact hole pattern or in a line and space pattern.

Figure 8B:
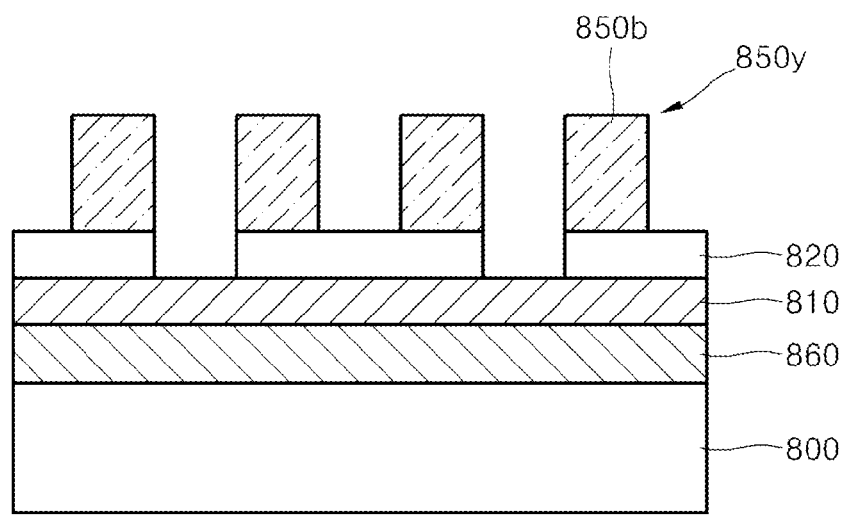

Referring to FIG. 8B, any one of the first block 850*a* and the second block 850*b* is removed from the fine pattern layer 850 to form a fine mask pattern 850*y*. The fine mask pattern 850*y* may be formed in the same manner described with reference to FIG. 7B.

Figure 8C:
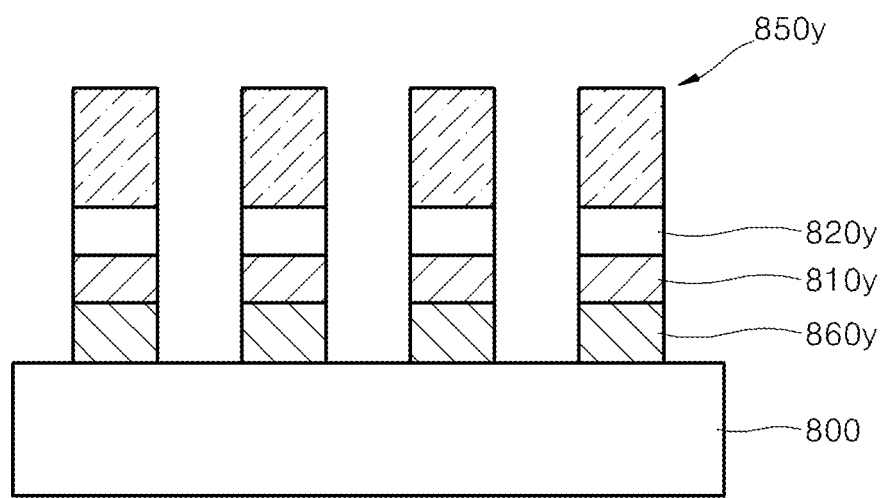

Referring to FIG. 8C, using the fine mask pattern 850*y* as an etch mask, the exposed portion of the phase separation guide layer 810, the exposed portion of the neutral pattern 820, and the phase separation guide layer 810 thereunder are etched, and then the substrate 860 is etched to form a desired fine pattern 860*y*.

Figure 8D:
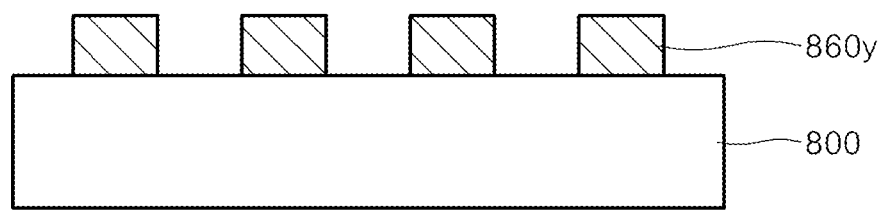

Referring to FIG. 8D, the fine mask pattern 850*y* is removed, and unnecessary films remaining on the fine mask pattern 860*y* are removed.

The fine pattern 860*y* may be, for example, any one selected from a conductive pattern, an insulating pattern, a gate conductor, a word line, a bit line, or a contact hole.

Figure 9:
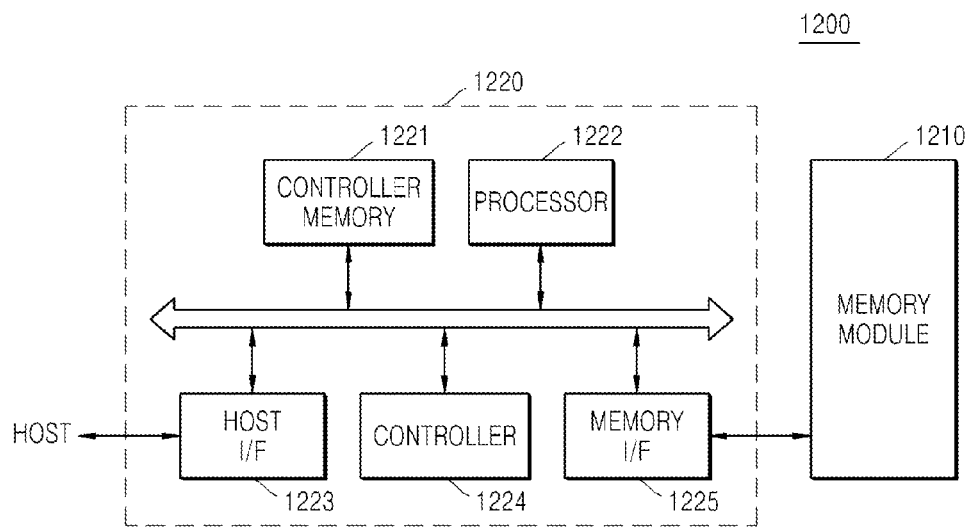
FIG. 9 is a block diagram of a memory card including semiconductor devices manufactured by the fine pattern forming methods according to an example embodiment of the inventive concepts.

FIG. 9 is a block diagram of a memory card 1200 including semiconductor devices manufactured by the fine pattern forming methods according to some example embodiments of the inventive concepts.

Referring to FIG. 9, the memory card 1200 includes a memory controller 1220 generating a command/address signal C/A, and a memory module 1210, for example, a flash memory including one or more flash memory devices. The memory controller 1220 includes a host interface (I/F) 1223 transmitting/receiving a command/address signal to/from a host, and a memory interface 1225 transmitting/receiving a command/address signal to/from the memory module 1210. The host interface 1223, a controller 1224, and the memory interface 1225 communicate with a controller memory 1221, such as a static random-access memory (SRAM), and a processor 1222, such as a central processing unit (CPU), through a common bus.

The memory module 1210 receives a command/address signal from the memory controller 1220, and stores/reads data into/from at least one of memory devices of the memory module 1210 as a response thereto. Each of the memory devices includes a plurality of addressable memory cells, and a decoder receiving a command/address signal and generating a row signal and a column signal for accessing at least one of the addressable memory cells in a program/read operation.

The respective components of the memory card 1200 including the memory controller 1220, the electronic devices 1221, 1222, 1223, 1224, and 1225 included in the memory controller 1220, and the memory module 1210 may include semiconductor devices that are manufactured by the fine pitch forming methods according to the above-described example embodiments of the inventive concepts.

Figure 10:
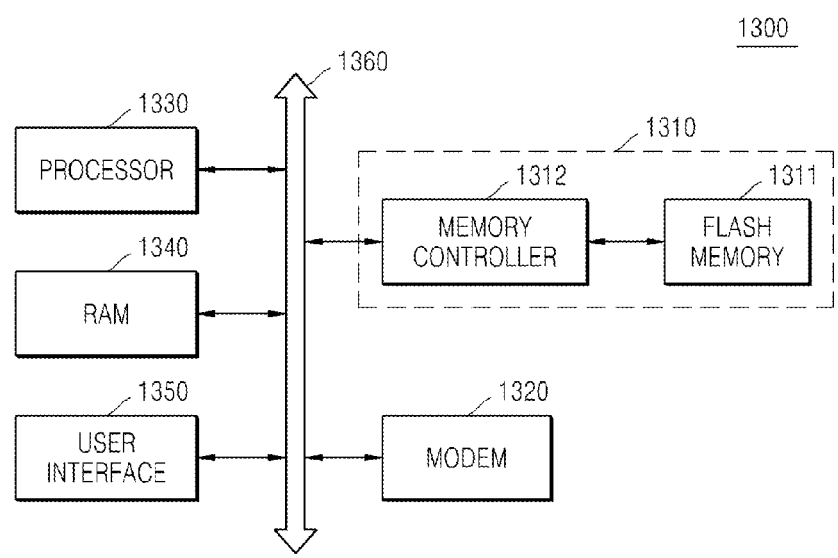
FIG. 10 is a block diagram of a memory system including a memory card including semiconductor devices manufactured by the fine pattern forming methods according to an example embodiment of the inventive concepts.

FIG. 10 is a block diagram of a memory system 1300 including a memory card 1310 including semiconductor devices manufactured by the fine pattern forming methods according to the above-described example embodiments of the inventive concepts.

Referring to FIG. 10, the memory system 1300 may include a processor 1330 such as a CPU, a random-access memory (RAM) 1340, a user interface 1350, and a modem 1320 that communicate through a common bus 1360. The processor 1330, the RAM 1340, the user interface 1350, and the modem 1320 transmit/receive signals to/from the memory card 1310 through the common bus 1360. The respective components of the memory system 1300 including the memory card 1310, the processor 1330, the RAM 1340, the user interface 1350, and the modem 1320 may include semiconductor devices that are manufactured by the fine pitch forming methods according to the example embodiments of the inventive concepts. The memory system 1300 may be applied to various electronic application fields. For example, the memory system 1300 may be applied to solid state drives (SSDs), complementary metal oxide semiconductor (CMOS) image sensors (CISs), and computer application chip sets.

The memory systems and devices described herein may be packaged in any one of various device package forms such as ball grid array (BGA), chip scale package (CSP), plastic leaded chip carrier (PLCC), plastic dual in-line package (PDIP), multi-chip package (MCP), wafer-level fabricated package (WFP), and wafer-level processed stock package (WSP); however, the inventive concepts are not limited thereto.

While the inventive concepts have been particularly shown and described with reference to example embodiments thereof, it will be understood that various changes in form and details may be made therein without departing from the spirit and scope of the following claims.

What is claimed is:

1. A method of forming a fine pattern, the method comprising:

forming a phase separation guide layer on a substrate;

forming a neutral layer on the phase separation guide layer;

forming a first pattern on the neutral layer, the first pattern including a plurality of first openings;

forming a second pattern including a plurality of second openings by changing the first pattern, each of the plurality of second openings having a smaller width than each of the plurality of first openings;

forming a neutral pattern by etching an exposed portion of the neutral layer using the second pattern as an etch mask, the neutral pattern including a plurality of guide patterns exposing a portion of the phase separation guide layer;

removing the second pattern to expose a top surface of the neutral pattern;

forming a material layer on the neutral pattern and the phase separation guide layer exposed through the plurality of guide patterns, the material layer including a block copolymer; and forming a fine pattern layer on the neutral pattern and the phase separation guide layer, the fine pattern layer including a first block and a second block;

wherein each of the plurality of second openings of the second pattern has a width that is equal to about half the width of any one of the first openings of the first pattern.

2. The method of claim 1, wherein the forming of the second pattern comprises: coating a property changing layer on the first pattern; heat-treating the first pattern coated with the property changing layer; and removing a property changing layer that remains after the heat-treating.

3. The method of claim 1, wherein the forming of the second pattern comprises forming a capping layer comprising an acid source on an exposed surface of the first pattern.

4. The method of claim 1, wherein the plurality of guide patterns of the neutral pattern are of a line type and are repetitively formed at a predetermined pitch in a first direction.

5. The method of claim 4, wherein when a width of each of the plurality of guide patterns in a predetermined direction is X, a width Y of the neutral pattern in the predetermined direction is $(2n+1)X$, where n is a positive integer.

* * * * *